(12) United States Patent
Murofushi et al.

(10) Patent No.: US 8,089,078 B2
(45) Date of Patent: Jan. 3, 2012

(54) LIGHT EMITTING DEVICE

(75) Inventors: Hitoshi Murofushi, Niiza (JP); Koji Otsuka, Niiza (JP); Nobuhisa Sugimori, Niiza (JP); Hideyuki Watanabe, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 365 days.

(21) Appl. No.: 12/412,902

(22) Filed: Mar. 27, 2009

(65) Prior Publication Data

US 2009/0242910 A1 Oct. 1, 2009

(30) Foreign Application Priority Data

Mar. 28, 2008 (JP) ................................. 2008-087631
Mar. 19, 2009 (JP) ................................. 2009-068300

(51) Int. Cl.
*H01L 33/00* (2010.01)
(52) U.S. Cl. ................................. 257/88; 257/E33.062
(58) Field of Classification Search .................... 257/88, 257/79, E33.062, E33.066, E33.012, 685, 257/678, 723
See application file for complete search history.

(56) References Cited

U.S. PATENT DOCUMENTS

| | | | | |
|---|---|---|---|---|
| 4,241,281 A | * | 12/1980 | Morimoto et al. | 315/161 |
| 2004/0037079 A1 | * | 2/2004 | Luk | 362/252 |
| 2004/0080941 A1 | * | 4/2004 | Jiang et al. | 362/252 |
| 2006/0163589 A1 | * | 7/2006 | Fan et al. | 257/88 |
| 2008/0017871 A1 | * | 1/2008 | Lee et al. | 257/88 |

FOREIGN PATENT DOCUMENTS

| | | |
|---|---|---|
| JP | 56-112756 | 9/1981 |
| JP | 60-201380 | 10/1985 |
| JP | 2000-223742 | 8/2000 |
| JP | 2004-14899 | 1/2004 |
| JP | 2005-259754 | 9/2005 |
| JP | 2007-157969 | 6/2007 |
| JP | 2008-72141 | 3/2008 |
| WO | WO/2006/004337 | * 1/2006 |

\* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A light emitting device includes: a first semiconductor region; a second semiconductor region and third semiconductor region which are provided in the first semiconductor region; a first semiconductor light emitting element of which first electrode is electrically connected to a main surface of the second semiconductor region; a second semiconductor light emitting element of which third electrode is electrically connected to a main surface of the third semiconductor region; and a conductor which electrically connects the second electrode of the first semiconductor light emitting element and the third semiconductor region, and which electrically connects the second electrode and the third electrode through the third semiconductor region. In the light emitting device, the semiconductor light emitting elements are connected in series, and are directly connected to a power source.

18 Claims, 21 Drawing Sheets

LIGHT EMITTING DEVICE

CROSS REFERENCE TO RELATED APPLICATION

This application is based upon and claims the benefit of priority from the prior Japanese Patent Application No. 2008-087.631 filed on Mar. 28, 2008, and the prior Japanese Patent Application No. 2009-068.300 filed on Mar. 19, 2009, the entire contents of which are incorporated herein by reference.

BACKGROUND OF THE INVENTION

1. Field of the Invention

This invention relates to a light emitting device, and more particularly to a light emitting device which is lit whenever it is directly connected to a convenience receptacle of an AC power source or a terminal of a DC power source.

2. Description of the Related Art

Light emitting diodes (LEDs) are very popular, and are used as backup lights for electronic devices such as cellular phones, digital video cameras, personal digital assistances and so on. Light emitting diodes are also used as light emitting sources for displays, roadway signs, traffic signals and so on. In recent days, light emitting diodes are being widely applied as vehicle headlights, and ordinary lighting fixtures in place of electric bulbs and fluorescent bulbs. Usually, a battery unit serves as a power source for vehicle headlights, and supplies DC power. Generally, a battery voltage is 5 V, 6 V, 12 V, 9 V or 24 V. A commercial power source is applied to ordinary lighting fixtures, and provides AC power to them. A voltage of the AC power is 100 V, for instance.

A forward voltage $V_f$ of the light emitting diode is 3.8 V to 3.9 V, and is lower than a voltage of the battery and a voltage of the commercial power source. Therefore, the light emitting diode is destroyed when the DC power or the commercial power is directly applied between an anode electrode and a cathode electrode of the light emitting diode.

For the foregoing reasons, the light emitting diode itself is not utilized as a lighting fixture, but is applied as a light emitting device in combination with an AC/DC power supply circuit including voltage dividing resistors and a complicated circuitry.

An example of the foregoing light emitting device is disclosed in Japanese Patent Laid Open Publication No. 2004-14899.

In the related art, the voltage dividing resistors and power supply circuit tend to increase the number of electronic components to be assembled, and lead to a complicated configuration, which means that the light emitting device becomes expensive.

The invention has been contemplated to overcome the foregoing problems, and provides a light emitting device which does not need electronic components such as voltage dividing circuits and a power supply circuit, can have a simplified configuration, and can be fabricated at a reduced cost. Further, the invention provides a light emitting device which can be directly and easily connected to a battery or a commercial power source

SUMMARY OF THE INVENTION

According to a first feature of the embodiment of the invention, a light emitting device includes: a first semiconductor region having a first conductivity type; a second semiconductor region and a third semiconductor region which are provided in the first semiconductor region and have a second conductivity type opposite to the first conductivity type; a first semiconductor light emitting element of which first electrode is electrically connected to a main surface of the second semiconductor region, the first electrode carrying a first active layer and a second electrode thereon; a second semiconductor light emitting element of which third electrode is electrically connected to a main surface of the third semiconductor region, the third electrode carrying a second active layer and a fourth electrode thereon; a conductor which electrically connects the second electrode of the first semiconductor light emitting element and the third semiconductor region, and which electrically connects the second electrode and the third electrode through the third semiconductor region; a first pad electrically connected to the first electrode via the second semiconductor region, and electrically connecting the first electrode to one of terminals of a power source; and a second pad electrically connected to the fourth electrode, and electrically connecting the fourth electrode to the other terminal of the power source.

The light emitting device preferably includes: a first power source plug terminal electrically connected to the first pad, and electrically connecting the first pad to the one terminal of the power source; and a second power source plug terminal electrically connected to the second pad, and electrically connecting the second pad to the other terminal of the power source.

In the light emitting device, the first semiconductor light emitting element and the second semiconductor light emitting element are spirally and repeatedly arranged around the first pad or the second pad.

Further in the light emitting device, the first and second power source plug terminals are connected to terminals of a commercial AC 100 V power source, or a DC power source of 5 V, 6 V, 9 V, 12 V or 24 V.

Still further, in the light emitting device, a rectifier is provided between the first pad and the second semiconductor region, and between the second pad and the fourth electrode of the second semiconductor light emitting element.

Still further in the light emitting device, the first semiconductor region is an n type semiconductor substrate or an n type semiconductor region; the second and third semiconductor regions are p type semiconductor regions; the first electrode of the first semiconductor light emitting element and the third electrode of the second light emitting element include nitride group chemical semiconductor layers in which n type impurities are doped; and the second electrode of the first semiconductor light emitting element and the fourth electrode of the second semiconductor light emitting element include nitride group chemical layers in which p type impurities are doped.

In accordance with a second feature of the embodiment of the invention, a light emitting device includes: a substrate; a plurality of semiconductor light emitting elements including a first nitride semiconductor region having an n type conductivity type, a nitride active layer, and a second nitride semiconductor region having a p type conductivity type opposite to the n type conductivity type; a connecting conductor electrically connecting the first nitride semiconductor region of a first semiconductor element out of the plurality of semiconductor elements and the second nitride semiconductor region of a second semiconductor element, and electrically connecting the plurality of the semiconductor elements, the connecting conductor having Schottkey property with respect to the first nitride semiconductor region; a first pad electrically connected to one end of the plurality of semiconductor light emitting elements, and electrically connecting the semiconductor light emitting elements to one terminal of a power source; and a second pad electrically connected to the plurality of semiconductor elements, and electrically connecting the second semiconductor region to the other terminal of the power source.

Further, an amount of the current at an interface between the first nitride semiconductor region and the connecting conductor is equal to or less than 10 mA.

In accordance with a third feature of the embodiment of the invention, a light emitting device includes: a substrate; a plurality of semiconductor light emitting elements including a first semiconductor region having a first conductivity type, a first active layer, and a second semiconductor region having a second conductivity type opposite to the first conductivity type, and being electrically connected in series on one surface of the substrate; a first pad electrically connected to the first semiconductor region of a first semiconductor element at one end of the plurality of semiconductor elements, and electrically connecting the first semiconductor region to one terminal of a power source; a second pad electrically connected to the second semiconductor region of a second semiconductor element at the other end of the plurality of the semiconductor elements, and electrically connecting the second semiconductor region to the other end of the power source; and a reverse withstand voltage element which is electrically connected, on the substrate, between the first semiconductor region of the first semiconductor element and the first pad, and includes a third semiconductor region being flush with the first semiconductor region and having the first conductivity type, a second active layer being flush with the first active layer, and a fourth semiconductor region being flush with the first active layer and the semiconductor region, and having the second conductivity type.

The light emitting device according to the third feature further includes a backflow preventing element which is electrically connected between the second semiconductor region of the second light emitting element and the second pad, and includes a fifth semiconductor region being flush with the first semiconductor region and having the first conductivity type, a third active layer being flush with the first active layer, and a sixth semiconductor region being flush with the second semiconductor region and having the second conductivity type.

Further, the first pad is provided on a first island on the substrate, and the reverse withstand voltage overlaps with the first pad on the first island.

Still further, the second pad is provided on a second island on the substrate, and the backflow preventing element overlaps with the second pad on the second island.

According to a fourth feature of the embodiment of the invention, a light emitting device includes: a substrate; a plurality of semiconductor light emitting elements including a first semiconductor region having a first conductivity type, a first active layer, and a second semiconductor region having a second conductivity type opposite to the first conductivity type, and being electrically connected in series on one surface of the substrate; a first pad electrically connected to the first semiconductor region of a first semiconductor element at one end of the plurality of semiconductor elements, and electrically connecting the first semiconductor region to one terminal of a power source; a second pad electrically connected to the second semiconductor region of a second semiconductor element at the other end of the plurality of the semiconductor elements, and electrically connecting the second semiconductor region to the other end of the power source; and a bidirectional zener diode which is electrically connected, on the substrate, between the first semiconductor region of the first semiconductor element and the second semiconductor region of the second semiconductor element, and includes a third semiconductor region being flush with the first semiconductor region and having the first conductivity type, a second active layer being flush with the first active layer, and a fourth semiconductor region being flush with the first active layer and the semiconductor region, and having the second conductivity type.

Finally, either the first pad or the second pad is the substrate.

The invention provides the light emitting device which does not require electronic components such as voltage dividing resistors and a power supply circuit, and has a simplified configuration. Further, the light emitting device can be fabricated at a reduced cost. Still further, the light emitting device can be directly and easily connected to a battery or a commercial power source.

DETAILED DESCRIPTION OF THE EMBODIMENTS

Figure 1:
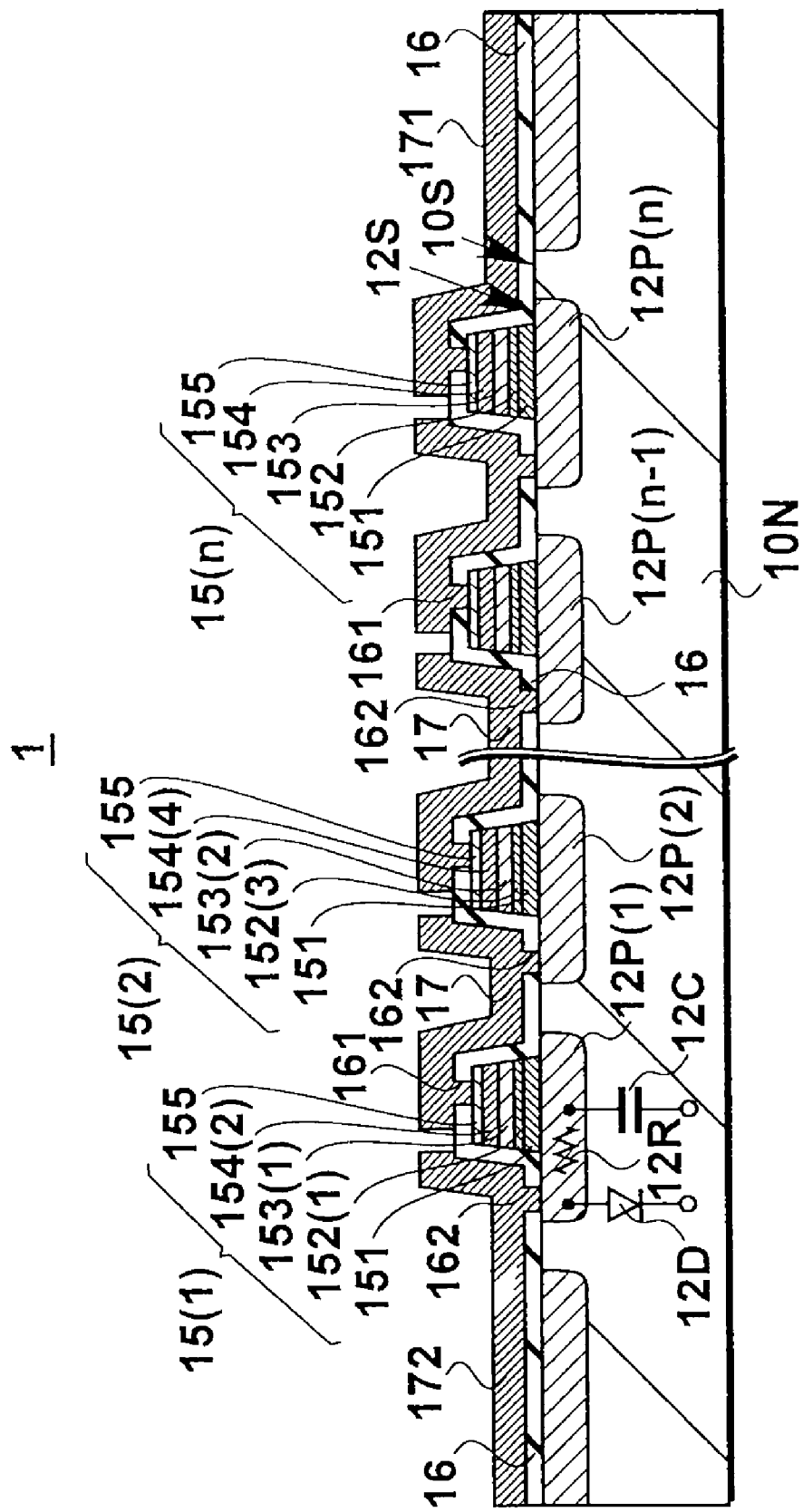
FIG. 1 is an enlarged cross sectional view of an essential part of a light emitting device according to a first embodiment of the invention.

The invention will be described with reference to embodiments shown in the drawings. Like or corresponding parts are denoted by like or corresponding reference numerals. Components shown in the drawings are schematic, and may be sometimes different from those of actual components. Dimensions of components may be different in drawings.

The following exemplify devices to bring the technical concept of the invention into shape. The technical concept of the invention does not always refer to specific arrangements of components constituting the light emitting device. Further, numerous modifications and variations could be made to the technical concept of the invention without departing from the scope of the invention set forth in the claims.

First Embodiment

According to a first embodiment, the invention provides a light emitting device which is compatible with a DC power source or an AC power source.

[Circuit Configuration of Light Emitting Device]

Figure 2:
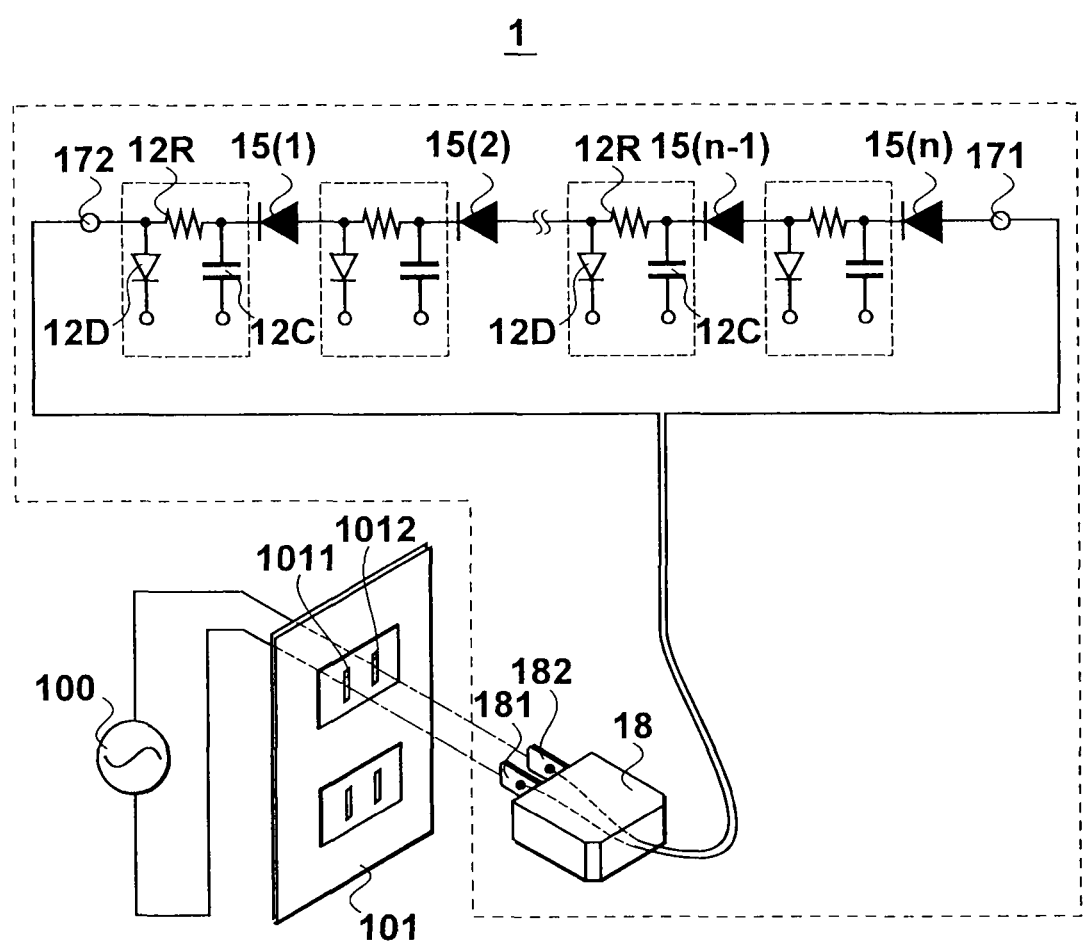
FIG. 2 is a circuit diagram of the light emitting device of the first embodiment.

Referring to FIG. 2, the light emitting device 1 includes: a plurality of semiconductor light emitting elements 15(1) to 15(n) which are connected in series; a second pad (a second bonding pad) 171 which is electrically connected to an electrode (i.e. an anode electrode) of the semiconductor light emitting element 15(n) at one end; and a first pad (a first bonding pad) 172 which is electrically connected to an electrode (i.e. a cathode electrode) of the semiconductor light emitting element 15(1) at the other end. A total number of the semiconductor light emitting elements 15 is an integer which is equal to 2 or larger. For instance, fifteen semiconductor light emitting elements 15 are provided in the first embodiment. Further, the light emitting device 1 includes a first power source plug terminal 181 and a second power source plug terminal 182. The first power source plug terminal 181 is electrically connected to the second pad 171 while second power source plug terminal 182 is electrically connected to the first pad 172. The light emitting device 1 is connected to terminals 1011 and 1012 of an external power source 100 via the first and second power source plug terminals 181 and 182.

In the first embodiment, semiconductor light emitting diodes are used as the semiconductor light emitting elements 15. The device structure of the semiconductor light emitting diodes will be described in detail later. The semiconductor light emitting elements 15 (referred to as "light emitting elements" hereinafter) are fabricated in the shape of semiconductor chips. The first and second pads 172 and 171 function as terminals via which the light emitting elements 15 are electrically connected to the external power source 100.

Further, the light emitting device 1 includes the following which are provided between the light emitting elements 15 connected in series: resistors 12R which are electrically connected in series; diodes 12D which are connected in parallel; and capacitors 12C which are electrically connected in parallel. The resistors 12R, diodes 12D and capacitors 12C will be described in detail later. The resistors 12R are prepared using diffusion resistance of semiconductor regions. The diodes 12D and capacitors 12C are prepared using pn junctions between semiconductor regions having different conduction types.

The first power source plug terminal 181 is electrically connected to the second pad 171 via a lead wire (to which no reference numeral is assigned), for instance. Similarly, the second power source plug terminal 181 is electrically connected to the first pad 172 via another lead wire. In the first embodiment, the first and second power source plug terminals 181 and 182 constitute a convenience plug 18. Further, the power source 100 receives commercial power which is supplied to homes or factories by an electric power company. The commercial power is AC and 100 V. In short, the terminals 1011 and 1012 constitute a convenience receptacle 101.

The AC 100 V commercial power is supplied to the power source 100 in the first embodiment. Alternatively, commercial of AC 200 V may be applied to the power source 100, for instance. In other words, the power source 100 is compatible to commercial power of AC 100 V, 115 V, 120 V, 210 V, 220 V, 230 V or 240 V which is popular in foreign countries but is not in use in Japan.

DC power in place of the AC power is applicable to the power source 100. The DC power is supplied by an accumulator battery (a secondary battery) or a battery (a primary battery). A power source voltage of a vehicle battery is 12 V or 24 V. Further, the power source voltage of the accumulator battery is higher than a forward voltage $V_f$ of the light emitting elements 15, i.e. the semiconductor light emitting diodes, and is 5 V, 6 V, 9 V or the like, for instance.

[Device Structure of Light Emitting Device]

The light emitting device 1 (shown in FIG. 2) is constituted by the following components as shown in FIG. 1: a first semiconductor region 10N having a first conductivity type; a second semiconductor region 12P(1) and a third semiconductor region 12P(2) both of which have a second conductivity type opposite to the first conductivity type, are island shaped in the first semiconductor region 10N, and are separate from each other; a first light emitting element 15(1); a second light emitting element 15(2); a conductor 17; the first pad 172; and the second pad 171. The first light emitting element 15(1) includes: a first electrode 152(1) electrically connected to a main surface 12S of the second semiconductor region 12P(1); a first active layer 153(1) and a second electrode 154(2) on the first electrode 152(1), all of which are stacked one over another. The second light emitting element 15(2) includes: a third electrode 152(3) electrically connected to the main surface 12S of the third semiconductor region 12P(2); a second active layer 153(2) and a fourth electrode 154(4) on the third electrode 152(3), all of which are stacked one over another. The conductor 17 electrically connects the second electrode 154(2) of the first light emitting element 15(1) to the third semiconductor region 12P(2), and electrically connects the second electrode 154(2) to the third electrode 152(3) via the third semiconductor region 12P(2). The first pad 172 is electrically connected to the first electrode 152(1) via the second semiconductor region 12P(1), and electrically connects the first light emitting element 15(1) to the terminal 1012 of the power source 100. The second pad 171 is electrically connected to the fourth electrode 154(4), and electrically connects the n number light emitting element 15(n) to the terminal 1011 of the power source 100.

In the first embodiment, the first conductivity type is the "n" type while the second conductivity type is the "p" type. The first semiconductor region 10N is an n type silicon single crystal substrate. The silicon single crystal substrate carries the first and third semiconductor regions 12(1) and 12(2) and other semiconductor regions on its the main surface 10S where a main surface 12S is present, and is also used to epitaxially grow a part of the light emitting elements 15 as thin films. The silicon single crystal substrate is 100 μm to 1000 μm thick. Specifically, the silicon single crystal substrate is designed to be several hundred μm thick, and has relatively low impurity density of approximately $1 \times 10^{17}$ atoms/cm$^3$ to $5 \times 10^{17}$ atoms/cm$^3$ in order that a depletion layer sufficiently extends to the semiconductor region 10N.

The second and third semiconductor regions 12P(1) and 12P(2) are formed by doping ions into or by diffusing impurities onto the main surface 10S of the first semiconductor region 10N. The second semiconductor region 12P(1) and the third semiconductor region 12P(2) are respectively in a state of the pn junction isolation with the first semiconductor region 10N. For this purpose, a potential having a reverse bias is applied to the first semiconductor region 10N.

Further, the second and third semiconductor regions 12P(1) and 12P(2) are used as a part of the conductor which is electrically connected in series between the light emitting elements 15, and constitute the resistors 12R, diodes 12D and capacitors 12C. Each resistor 12R is constituted by the second semiconductor region 12P(1) and the third semiconductor region 12P(2). An ohmic value of the resistors 12R depends upon density of the p type impurities, and a length and a sectional area of a current flowing path. In diodes 12D, the second and third semiconductor regions 12P(1) and 12P(2) function as anode regions, and the first semiconductor region 10N functions as a cathode region. In the capacitors 12C, the second and third semiconductor regions 12P(1) and 12P(2) function as one electrode while the first semiconductor region 10N is used as the other electrode. Further, the depletion layer formed at the pn junction is used as a dielectric body. For instance, both of the second and third semiconductor regions 12P(1) and 12P(2) are made of boron (B) having impurity density of $5 \times 10^{18}$ atoms/cm$^3$ to $1 \times 10^{19}$ atoms/cm$^3$, and have a junction depth of 4 μm to 10 μm.

The first light emitting element 15(1) includes the following: a buffer layers 151 in direct contact with the main surface 12S of the second semiconductor region 12P(1); a first electrode 152(1) on the buffer layer 151; a first active layer 153(1) on the first electrode 152(1); a second electrode 154(2) on the first active layer 153(1); and an optically transparent conductive film 155 on the second electrode 154(2). The second light emitting element 15(2) includes the following: a buffer layer 151 in direct contact with the main surface 12S of the third semiconductor region 12P(2); a third electrode 152(3) arranged on the buffer layer 151; a second active layer 153(2) on the third electrode 152(3); a fourth electrode 154(4) on the second active layer 153(2); and an optically transparent conductive film 155 on the fourth electrode 154(4).

In the first embodiment, each buffer layer 151 is of the n type, is made of a nitride group semiconductor, and includes nitride aluminum (AlN) layers doped with n type impurities and nitride gallium (GaN) layers doped with n type impurities. The nitride aluminum (AlN) layers and nitride gallium (GaN) layers are alternately stacked. For instance, each AlN layer is 0.5 nm to 5.0 nm thick while each GaN layer is 5 nm to 5500 nm thick.

The buffer layers 151 are not always required to be constituted by a plurality of the AlN layers and GaN layers. The AlN layers may be replaced by nitride group semiconductor layers such as indium aluminum nitride (AlInN) layers, gallium aluminum nitride (AlGaN) layers, and gallium indium aluminum nitride (AlInGaN) layers. Further, the GaN layers may be replaced by nitride group semiconductor layers such as gallium indium nitride (InGaN) layers, AlInN, AlGaN layers, and AlInGaN layers. Still further, each buffer layer 151 may be a single AlN layer, a single GaN layer, or a single layer of nitride group semiconductors. The buffer layers 151 may be omitted if the layers of the first light emitting element 15(1) demonstrate excellent epitaxial growth on the main surface 12S of the second semiconductor region 12P(1) and the layers of the third semiconductor region 15(2) demonstrate excellent epitaxial growth on the main surface 12S of the third semiconductor region and 12P(2). It is assumed here that the first and third electrodes 152(1) and 152(3) on the buffer layers 151 are made of n type semiconductor layers. This means that the buffer layers 151 have the conductivity same as that of the first and third electrodes 152(1) and 152 (3). In such a case, the buffer layers 151 in combination with the first electrode 152(1) may function as the first electrode, and the buffer layers 151 in combination with the third electrode 152(3) may function as the third electrode.

The first electrode 152(1) is an n type clad layer disposed between the buffer layer 151 and the first active layer 153(1). Similarly, the third electrode 152(3) is an n type clad layer disposed between the buffer layer 151 and the second active layer 153(2). The n type clad layer have a band gap which is larger than band gaps of the first and second active layers 153(1) and 153(2). Nitride group semiconductors such as n type GaN layers are used as the n type clad layers. Alternatively, the n type clad layers may be chemical group semiconductors such as AlInGaN and AlGaN.

In order to constitute a double hetero junction LED, the first active layer 153(1) is placed between the first electrode 152(1) (n type clad layer) and the second electrode 154(2) (p type clad layer). The second active layer 153(2) is placed between the third electrode 152(3) (n type clad layer) and the fourth electrode 154(4) (p type clad layer). The first and second active layers 153(1) and 153(2) are made of nitride group semiconductors such as InGaN.

In FIG. 1, each of the first and second active layers 153(1) and 153(2) is schematically depicted as one layer, but is in the shape of the multiquantum well (MQW). Alternatively, each of the first and second active layers 153(1) and 153(2) may be in the shape of a single quantum well (SQW) or in the shape of a single semiconductor layer. The first active layer 153(1) may be omitted if the first and second electrodes 152(1) and 154(2) are directly joined. The second active layer 153(3) may be omitted if the third and fourth electrodes 152(3) and 154(4) are directly joined.

Both of the second and fourth electrodes 154(2) and 154(4) are p type clad layers, which have large bandgaps compared to band gaps of the first and second active layers 153(1) and 153(2). The p-type clad layers are made of nitride group semiconductors such as p type GaN semiconductor layers. Alternatively, the p type clad layers may be made of chemical group semiconductor layers such as AlInGaN or AlGaN semiconductor layers.

Each optically transparent conductive film 155 is laid on the second and fourth electrodes 154(2) and 154(4), and is connected to them with low resistance (i.e. is in ohmic contact with them). The optically transparent conductive films 155 are made of indium tin oxide (ITO) layers, for instance, and function to unify a distribution of currents flowing to the semiconductor light emitting elements 15. The optically transparent conductive films 155 may be omitted if no uniform current distribution is required.

The first electrode 152(1) of the first light emitting element 15(1) is electrically connected to the first pad 172 via the buffer layer 151 of the first light emitting element 15(1) and the second semiconductor region 12P(1). An interlayer dielectric film 16 is provided on a side surface of the first light emitting element 15(1), or on the main surface 12S of the second semiconductor region 12P(1). The first pad 172 is placed on the interlayer dielectric film 16. The first pad 172 and the second semiconductor region 12P(1) are connected through a via hole 162 made in the interlayer dielectric film 16. The first pad 172 may be made of a gold (Au) film. The interlayer dielectric film 16 may be made of a silicon oxide film.

The second semiconductor region 12P(1) made of p type silicon and the n type buffer layer 151 of the first light emitting element 15(1) are in electrical contact with each other. Further, the third semiconductor region 12P(2) made of p type silicon and the n type buffer layer 151 of the second light emitting element 15(2) are in electrical contact with each other. The electrical contact is the hetero junction. It is inferred that an alloyed region (not shown) is created on contact interfacial areas of the foregoing components. Therefore, when a forward voltage is applied to the first and second light emitting elements 15(1) and 15(2), a voltage drop is small in the hetero junction between the forgoing components compared with a voltage drop in the hetero junction between n type silicon and an n type buffer layers. The voltage drop is approximately 0.4 V in the hetero junction. If an n type buffer layer made of a nitride semiconductor such as a GaN semiconductor is formed on n type silicon, III group elements of Ga or the like serve as p type impurities to the silicon, and cause a pn junction in the n type silicon. The pn junction leads to a voltage drop. It is assumed that the second and third semiconductor regions 12P(1) and 12P(2) and so on are made of n type silicon, and that the n type buffer 151 is formed on these semiconductor regions. In such a case, the voltage drop in the hetero junction is relatively small, the first semiconductor region 10N is made to be a semiconductor region constituted by p type silicon, so that the second and third semiconductor regions 12P(1) and 12P(2) and so on may be replaced with semiconductor regions made of the n type silicon.

In the first embodiment, the connections between the following are the same: between the first and second light emitting elements 15(1) and 15(2); between the second and third light emitting elements 15(2) and 15(3); between the third and fourth light emitting elements 15(3) and 15(4); and between the other light emitting elements 15. In other words, the first and second light emitting elements 15(1) and 15(2) are a unit cell of a repeated arrangement pattern. The unit cells are repeatedly arranged between the first and second pads 172 and 171. Each light emitting element 15 is designed to be approximately 30 μm long in the first embodiment.

A conductor 17 electrically connects the second electrode 154(2) of the first light emitting element 15(1) to the third semiconductor region 12P(2) to which the third electrode 152(3) of the second light emitting 15(2) is electrically connected. In the first embodiment, the conductor 17 is made of a conductive material same as that of the first and second pads 172 and 171, and is flush with the foregoing pads 172 and 171. The conductor 17 has its one end electrically connected to the second electrode 154(2) through a via hole 161 in the interlayer dielectric film 16, and the other end electrically connected to the main surface 12S of the third semiconductor region 12P(3) through the via hole 162 in the interlayer dielectric film 16. In the similar manner, the fourth electrode 154(4) of the second light emitting element 15(2) is electrically connected to the fourth semiconductor region 12P(3) by the conductor 17.

[Planar Structure of Light Emitting Elements]

Figure 3:
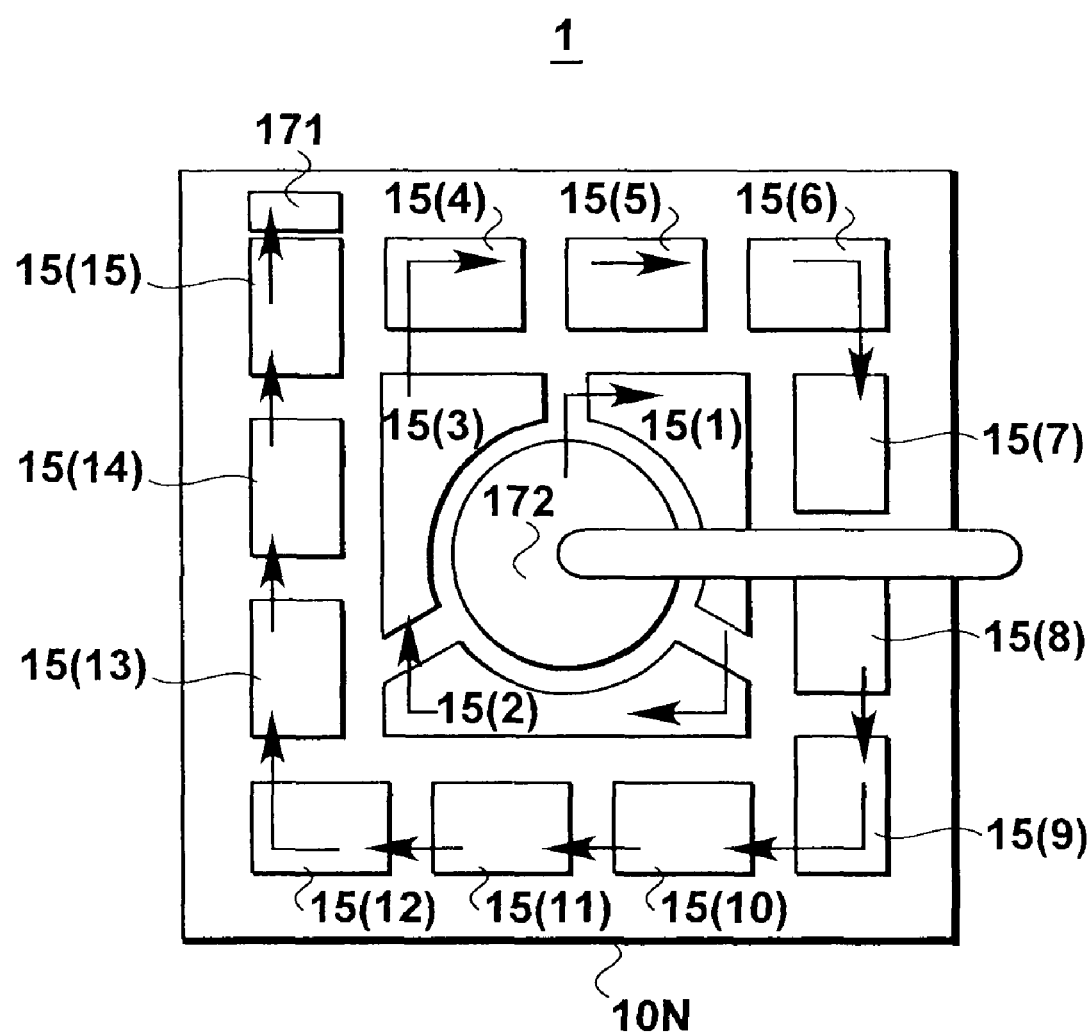
FIG. 3 is a top plan view of the light emitting device of the first embodiment.

The light emitting device 1 is structured as shown in FIG. 3 in which components are observed in the direction of a planar normal line with respect to the main surface 10S of the first semiconductor region (substrate) 10N. Specifically, the first pad 172 is positioned at the center. The first light emitting element 15(1), the second light emitting element 15(2), the third light emitting element 15(3), the fourth light emitting element 15(4), . . . , the (n)th light emitting element 15(n) are arranged around the first pad 172 in the Archimedean or spirals approximate to the Archimedean. Spaces between adjacent light emitting elements 15 have a uniform length. Needless to say, the (n)th light emitting element 15(n), the (n−1)th light emitting element 15(n−1), . . . , may be spirally arranged around the second pad 171. Even if the second pad 171 is arranged around the first pad 172 at an end of the first semiconductor region 10N, electric field distribution from the center of the first semiconductor region 10N to the end does not become eccentric. Therefore, it is possible to control the pn junction between the first semiconductor region 10N and the second semiconductor regions 12P when the power source is turned on.

In the light emitting device of the first embodiment, a plurality of light emitting elements 15(1) to 15(n) which are in the shape of minute cells are arranged as an aggregate on the first semiconductor region 10N, or one semiconductor chip. The light emitting elements 15 in the shape of the minute cells can efficiently emit light from the side surfaces thereof.

Figure 4:
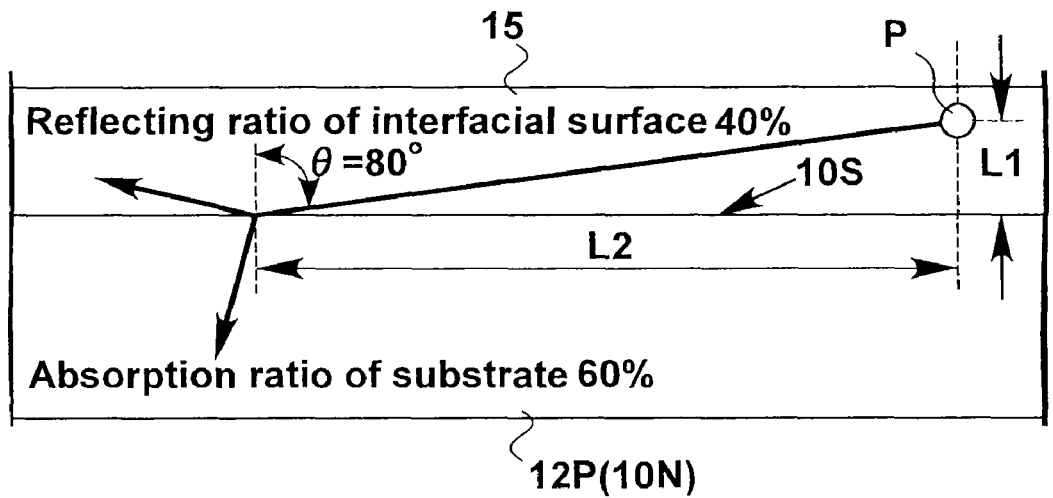
FIG. 4 schematically shows a cross section structure of the light emitting device.
Figure 5:
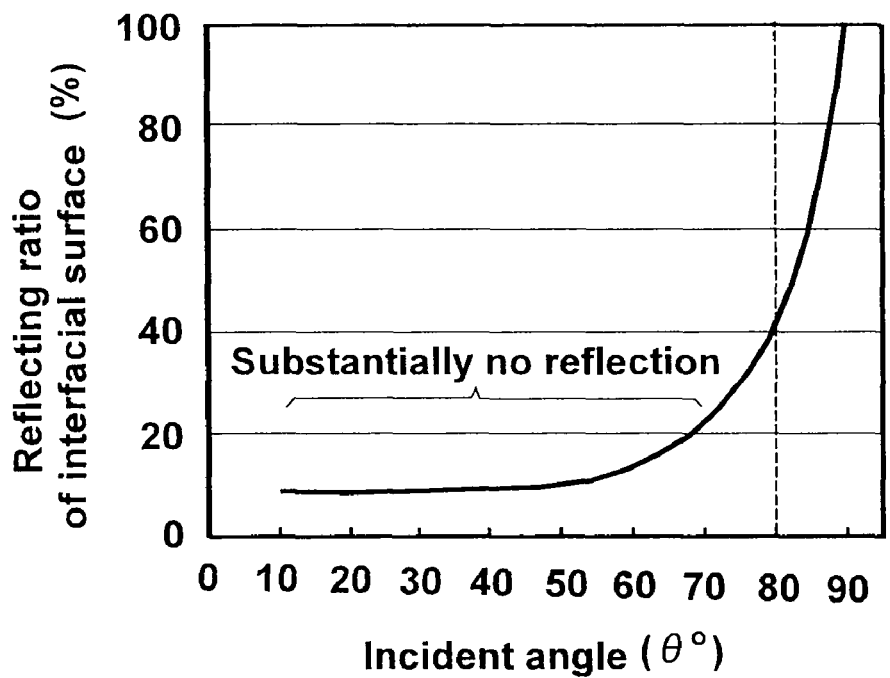
FIG. 5 is a graph showing the relationship between an interfacial reflection ratio and an incident angle, explaining light reflecting efficiency of the light emitting device of the first embodiment.

Referring to FIG. 4, it is assumed here that a distance L1 is present along the planar normal line between a light emitting point P of the light emitting elements 15 and the main surface 10S of the first semiconductor region 10N, and that a distance L2 to the incident point P is present between the light emitting point P and the main surface 10S of the first semiconductor region (silicon substrate) 10N. The relationship is established between an incident angle θ and an interfacial reflection ratio as shown in FIG. 5. In FIG. 5, the abscissa denotes the incident angle θ of light which is emitted at the light emitting point P and is incident onto the main surface 10P of the first semiconductor region (silicon substrate) 10N. The incident angle θ is defined by the planar normal line of the main surface 10P and an angle of an optical axis of the incident light. The ordinate denotes the interfacial reflection ratio (%) defined by the main surface 10S and the light emitting elements 15.

When the incident angle of light emitted from the light emitting point P is approximately 0 degrees to 60 degrees as shown in FIG. 5, the light will be absorbed at the first semiconductor region 10N. Since the reflection ratio of the main surface 10S is small, an expected amount of reflected light is not so large. If the incident angle of the light is approximately 70 degrees to 90 degrees, the reflection ratio is increased at the interfacial surface, so that the reflected light will be present as expected. The distance L2 from the light emitting point P cannot be infinite. An increase of the reflection ratio and an increase of planar dimensions of light emitting windows are balanced in appropriate ranges. The increase of planar dimensions of the light emitting windows results from an increased number of arrays of the light emitting elements 15 since the light emitting elements 15 are minimized in the shape of minute cells. In the first embodiment, the distance L1 between the light emitting point P and the main surface 10P is 2 μm, for instance while the distance L2 between the light emitting point P and the incident position is 11 μm, for instance. Therefore, the light from the light emitting point P is incident at the incident position with the incident angle θ of approximately 80 degrees. Although approximately 60% of the light from the light emitting point P is absorbed at the incident position, a high reflection ratio of 40% is accomplished. With the light emitting device 1, it is possible to increase the dimensional areas of the light emitting windows, the light reflection ratio at the interfacial surface, and a ratio of light emission from the side surfaces. In the first embodiment, the length of the light emitting elements 15 is designed in order to improve the light emitting ratio.

[Light Emitting Operation of Light Emitting Device]

The following describe the light emitting operation of the light emitting device 1. It is assumed here that the light emitting device 1 includes a total of 15 light emitting elements 15(1) to 15(n=15) which are connected in series.

With the light emitting device 1 shown in FIG. 2, the convenience plug 18 is put in a convenience receptacle 101 which is connected to the AC power source 100. A positive voltage is applied to the second power plug terminal 182 of the convenience plug 18 while a negative voltage is applied to the first power plug terminal 181. In this state, a current flows to the light emitting element 15(1) via the first pad 172 and the second semiconductor region 12P(1). Since the current flows in a reverse direction, the first light emitting element 15(1) does not emit light (as shown in FIG. 1 and FIG. 2).

On the other hand, when the positive voltage is applied to the first power plug terminal 181 of the convenience plug 18, and the negative voltage is applied to the second power plug terminal 182, the current flows through the first pad 172, (n)th light emitting element 15(n), (n+1)th semiconductor region 12P(n), and conductor 17. Further, the current flows to the second power plug terminal 182 through the (n−1)th light emitting element 15(n−1), (n−1)th light emitting element 15(n)th, (n)th semiconductor region 12P(n−1), conductor 17, ..., first light emitting element 15(1), second semiconductor region 12P(1), and second pad 171. The forward current flows to the light emitting elements 15(1) to 15(n), so that these light emitting elements 15 emit light. Since the power source 100 supplies the AC current, the light emitting device 1 intermittently emits light in response to a frequency of the AC power source 100.

The light emitting elements 15(1) to 15(n) are connected in series. The voltage applied to each light emitting element 15 is (voltage V)/(the total number of light emitting elements) at maximum, so long as the voltage V is applied between the first and second plug terminals 181 and 182. In this case, voltage variations in the light emitting elements 15 are not taken into consideration. If a relatively high voltage should be applied between the first and second plug terminals 181 and 182, the total number of light emitting elements 15 to be connected in series will be increased.

The voltage applied to each light emitting element 15 may be regulated by adjusting density of impurities in the second semiconductor region 12P(1), third semiconductor region 12P(2), ... (n+1)th semiconductor region 12p(n), and varying threshold values of the resistance of the resistors 12R, capacitance of the capacitors 12C, and diodes 12D.

The light emitting device 1 of the first embodiment may be operated by using the accumulator battery or the battery as the power source 100. In such a case, the total number of light emitting elements 15 connected in series and the resistance of the resistors 12R or the like are regulated in response to a voltage V applied to the first and second power plug terminals 181 and 182. When the power source 100 supplies DC power, and when the forward current flows, the light emitting device 1 continuously emits light.

As described above, the light emitting device 1 does not require any electronic components like a voltage dividing circuit and a power supply circuit, and has a simplified structure. Further, in the light emitting device 1, the resistors 12R and so on are provided in the first semiconductor region 10N, so that electronic components are not required, which is effective in reducing a manufacturing cost. Still further, the light emitting device 1 can emit light immediately whenever it is connected to the accumulator battery or the battery, or the commercial power source.

Second Embodiment

A light emitting device 1 according to a second embodiment is especially compatible to an AC power source, and can emit light continuously.

[Circuitry of Light Emitting Device]

Figure 6:
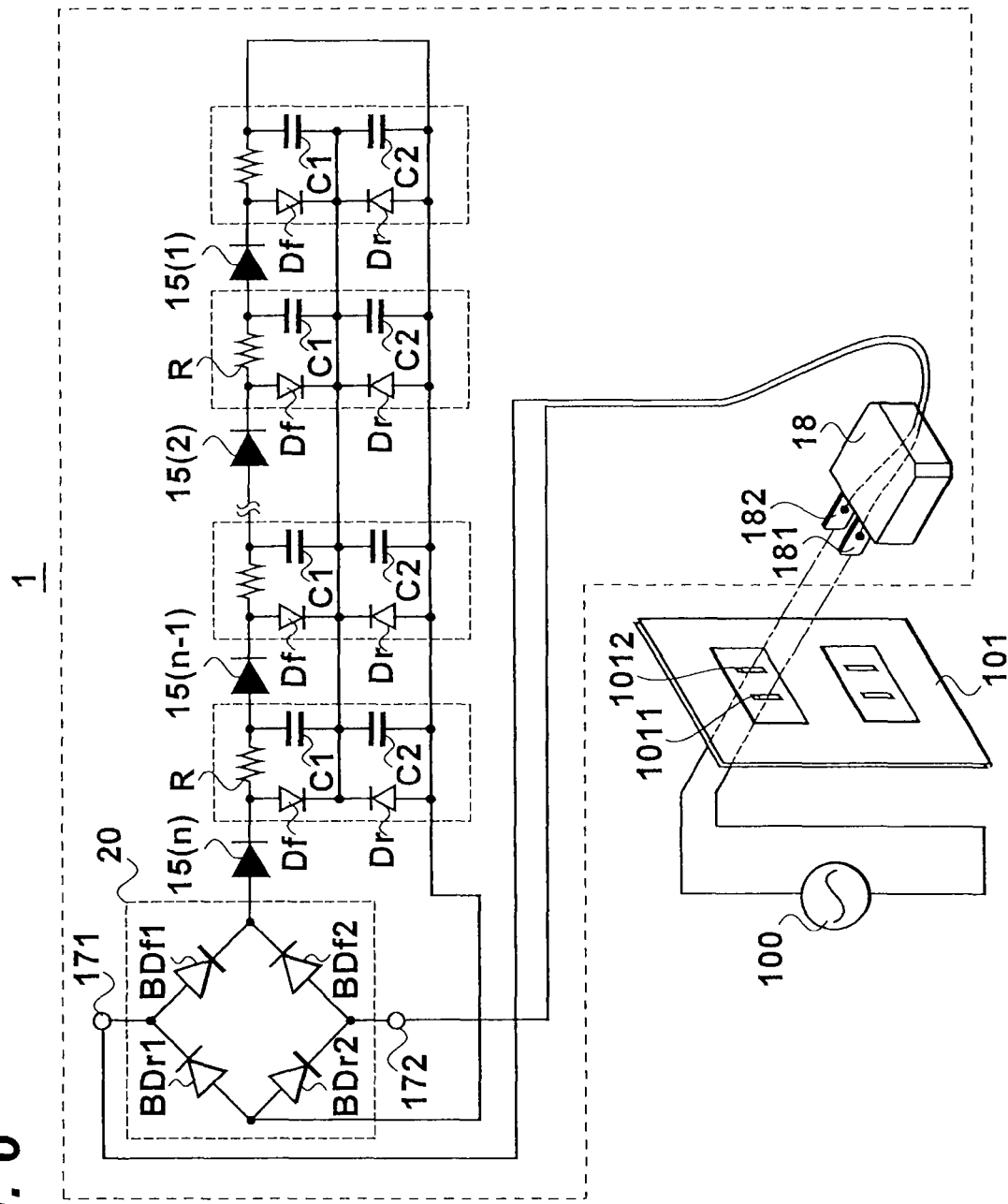
FIG. 6 is a circuit diagram of a light emitting device according to a second embodiment of the invention.

Referring to FIG. 6, the light emitting device 1 includes a rectifier 20 positioned between a plurality of light emitting elements 15(1) to 15(n) and the convenience plug 18 (or the first and second pads 172 and 171) connected to the power source 100. The rectifier 20 includes a forward diode BDf1, a forward diode BDf2, a reverse diode BDr1, and a reverse diode BDr2. The forward diode BDf1 has its anode electrode electrically connected to the second pad 171 and its cathode electrode electrically connected a 2nth electrode 154(2n) of the (n)th light emitting element 15(n). The forward diode BDf2 has its anode electrode electrically connected to the first pad 172 and its cathode electrically connected to the (2n)th electrode 152(2n). The reverse diode BDr1 has its cathode electrode electrically connected to the second pad 171. The reverse diode BDr2 has its cathode electrode electrically connected to the first pad 172 and its anode electrode electrically connected to the anode electrode of the reverse diode BDr1. In short, the rectifier 20 is constituted by a rectifying diode bridge.

In this second embodiment, the following components are provided between a plurality of light emitting elements 15 which are connected series: resistors R electrically connected in series; forward diodes Df connected in parallel; reverse diodes Dr electrically connected to the forward diode Df in series; capacitors C1 electrically connected in parallel; and capacitors C2 electrically connected to the capacitors C1 in parallel. Details of the foregoing components will be described later. The resistors R are made using diffused resistors of the semiconductor regions. The diodes Df and Dr, and capacitors C1 and C2 are made using the pn junctions between the semiconductor regions having different conductivity types. Further, in order to increase a withstand pressure between the (1n)th electrode 152(n) and a rear surface (the rear main surface 10T) of the semiconductor region 10P, the pnp structure is employed at an area immediately under the light emitting elements.

The remaining structure of the light emitting device 1 of the second embodiment is essentially similar to that of the light emitting device 1 of the first embodiment. For instance, the convenience plug 18 and so on are also utilized in the second embodiment.

[Device Structure of Light Emitting Device]

Figure 7:
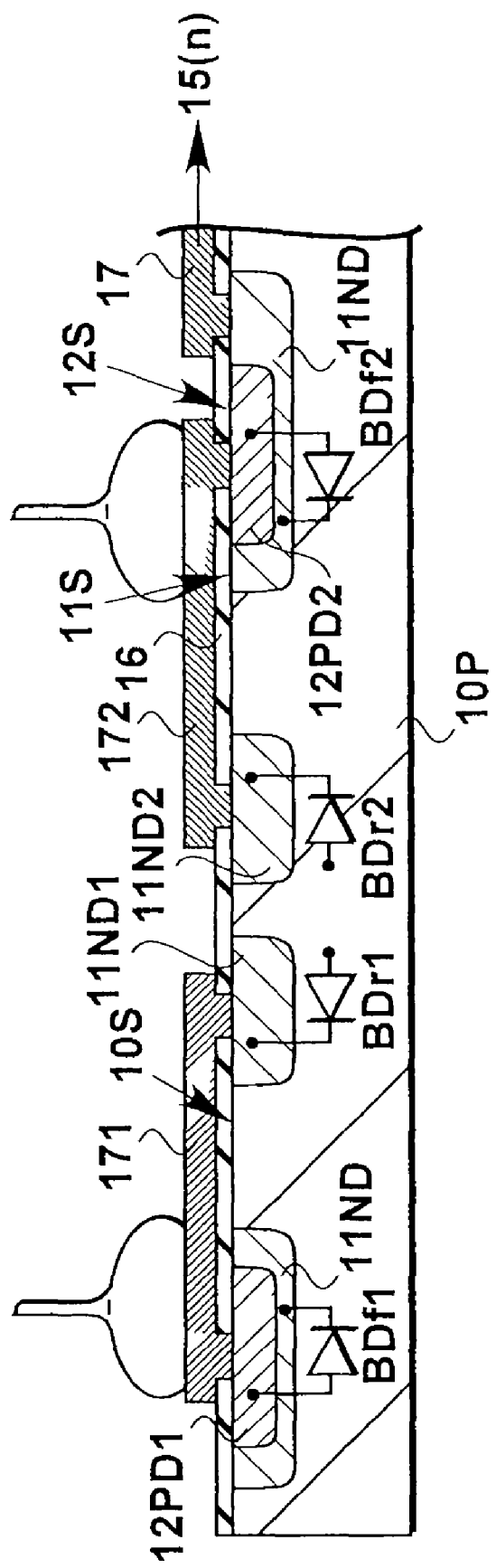
FIG. 7 is an enlarged cross sectional view of an essential part of the light emitting device of the second embodiment.
Figure 8:
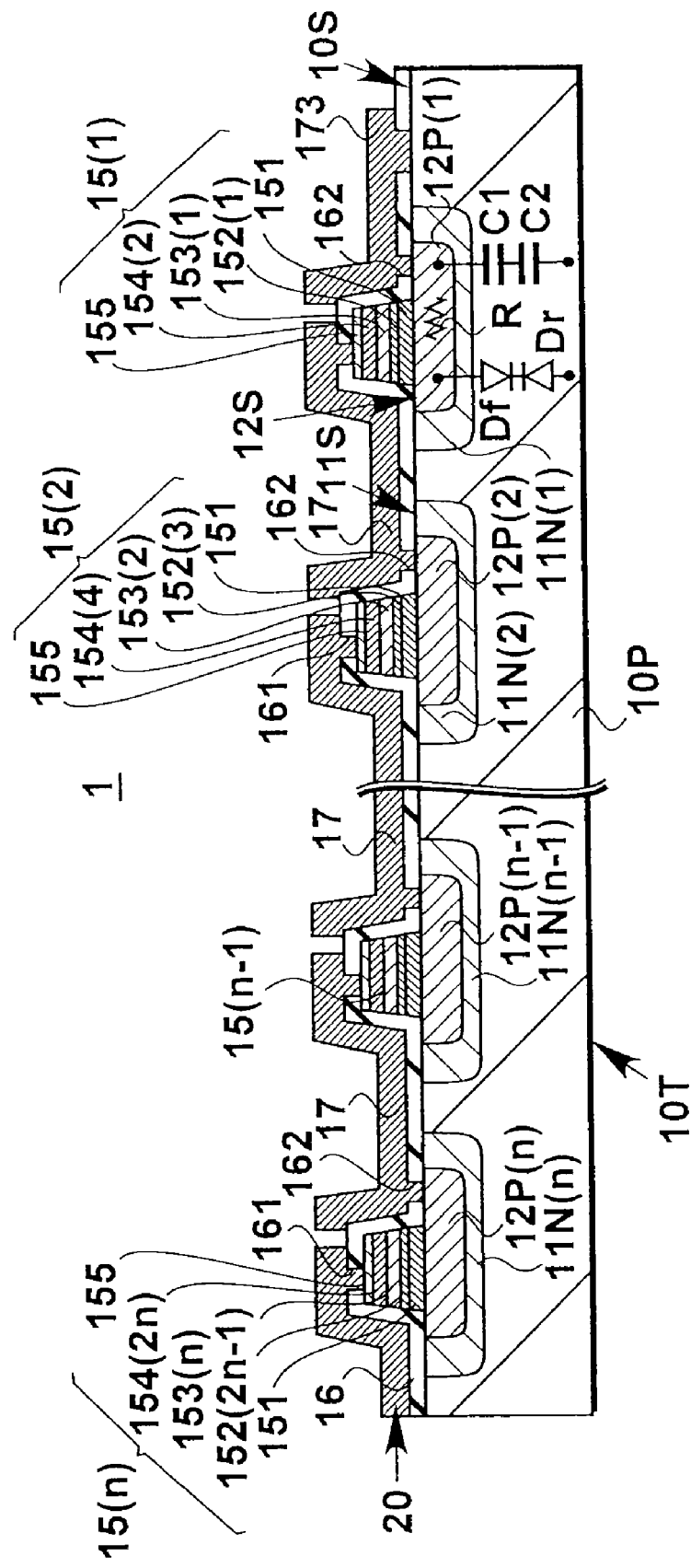
FIG. 8 is an enlarged cross sectional view if a rectifier of the light emitting device in the second embodiment.
Figure 9:
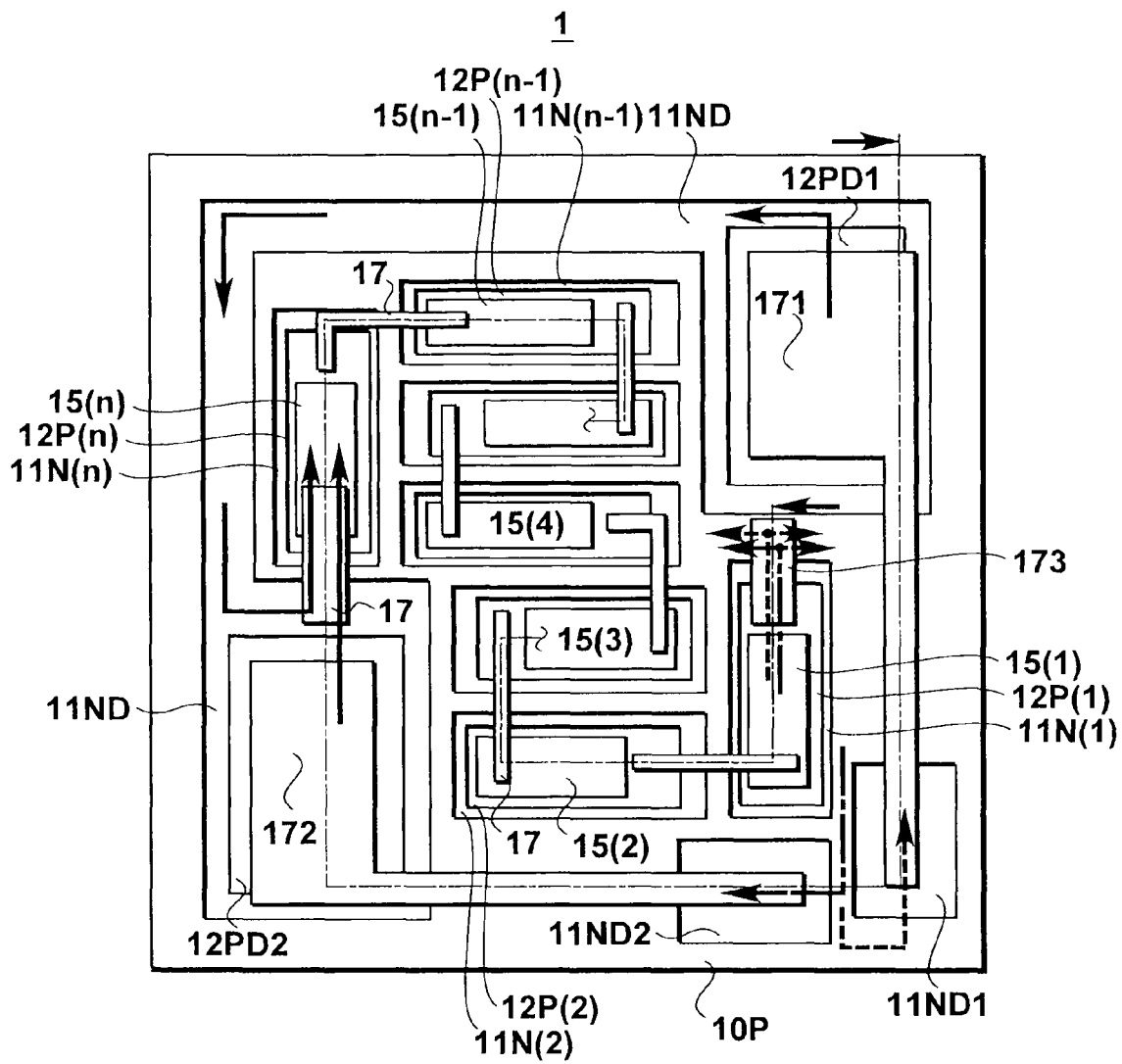
FIG. 9 is a top plan view of the light emitting device of the second embodiment.

Referring to FIG. 7 to FIG. 9, the light emitting device 1 includes the following components: first semiconductor regions 11N(1) and 11N(2) having the first conductivity type: a second semiconductor region 12P(1) and a third semiconductor region 12P(2) which are arranged in the shape of islands in the first semiconductor regions 11N(1) and 11N(2) and have the second conductivity type opposite to the first conductivity type; a first light emitting element 15(1) in which a first electrode 152(1) is electrically connected to the semiconductor region 12P(1) on its main surface 12S, and a first active layer 153(1) and a second electrode 154(2) are arranged on the first electrode 152(1); a second light emitting element 15(2) in which a third electrode 152(3) is electrically connected to a third semiconductor region 12P(2) on its main surface 12S, and a second active layer 153(2) and a fourth electrode 154(4) are arranged on the third electrode 152(3); a conductor 17 which electrically connects the second electrode 154(2) of the first light emitting element 15(1) and the third semiconductor region 12P(2), and electrically connects the second electrode 154(2) to the third electrode 152(3) via the third semiconductor region 12P(2); a first pad 172 which is electrically connected to the first electrode 152(1) via the second semiconductor region 12P(1) and connects to a power source terminal 1012 of the power source 100; and a second pad 171 which is electrically connected to the fourth electrode 154(4) and connects to a power source terminal 1011 of the power source 100.

FIG. 7 shows a cross—sectional structure of a rectifier 20 (shown in FIG. 6 and FIG. 9), and FIG. 8 shows a cross—sectional structure of a plurality of light emitting elements 15 electrically arranged in series. In the second embodiment, the first conductivity type is the n type while the second conductivity type is the p type as in the first embodiment. The first semiconductor regions 11N are made of n type semiconductor regions of which a junction depth is larger than those of the second and third semiconductor regions 12P(1) and 12P(2). The first semiconductor regions 11N are separate from one another and are in the shape of islands on the main surface 10S (shown at the upper sides in FIG. 7 and FIG. 8) where the main surface 12S of a p type single crystal silicon substrate is present. The semiconductor region 10P (silicon single crystal substrate) has a plurality of first semiconductor regions 11N(1), 11N(2), . . . , 11N(n), and serves as a substrate for promoting the epitaxial growth of a part of the semiconductor region 10P, and for accomplishing sufficient withstand pressure by lengthening a depletion layer produced at the pn junction between the semiconductor region 10P and the first semiconductor region 11N(n).

The p type silicon single crystal substrate has a sufficient thickness of several hundred μm (700 μm, for instance) which is larger than the thicknesses of the first, second and third semiconductor regions. The semiconductor region 10P has impurity density which is sufficiently lower than the impurity density of the second and third semiconductor regions 12P(n), and is equal to or lower than $7\times10^{14}$ atoms/cm$^3$, for instance.

The first semiconductor regions 11N(1), 11N(2) and so on separately correspond to the second semiconductor regions 12P(1), the third semiconductor region 12P(2) and so on. The first semiconductor regions 11N are fabricated by the ion implantation or impurity diffusion, and are made of either arsenic (As) or phosphoric acid (P) having impurity density of approximately $1\times10^{17}$ atoms/cm$^3$ to $5\times10^{17}$ atoms/cm$^3$. The first semiconductor regions 11N have a junction depth of 4 μm to 7 μm, for instance.

The second semiconductor region 12P(1) and third semiconductor region 12P(2) are formed on the main surface 11S of the first semiconductor regions 11N by the ion implantation or impurity diffusion. The second semiconductor region 12P(1) is in the pn junction isolation from other regions by the first semiconductor region 11N(1). The third semiconductor region 12P(2) is in the pn junction isolation from other regions by the first semiconductor region 11N(2). It is preferable that a potential having a reverse bias is supplied to the first semiconductor regions 10N. In this embodiment, the reverse bias potential is supplied by a reverse diode Dr. Impurity density of the second and third semiconductor regions 12P(n) is designed to be $5\times10^8$ atoms/cm$^3$ to $1\times10^{19}$ atoms/cm$^3$, for instance.

The second semiconductor region 12P(1) and third semiconductor region 12P(2) are used as a part of the conductor between the light emitting elements 15 which are electrically connected in series, and also constitute the resistors R, forward diodes Df, reverse diodes Dr, and capacitors C1 and C2. The resistors R are constituted by the second and third semiconductor regions 12P(1) and 12P(2). Resistance of the resistors R is adjusted on the basis of density of p type impurities, and a length and a sectional area of a current flowing path.

Each forward diode Df includes an anode region constituted by the second and third semiconductor regions 12P(1) and 12P(2), and a cathode region constituted by the first semiconductor regions 11N(1) and 11N(2). The reverse diode Dr includes a cathode region constituted by the first semiconductor regions 11N(1) and 11N(2), and an anode region constituted by the semiconductor regions 10P.

In the capacitor C1, the second and third semiconductor regions 12P(1) and 12P(2) are used as one electrode, the first semiconductors 11N(1) and 11N(2) are used as the other electrode. A depletion layer is created at the pn junction between the first semiconductor regions 11N and semiconductor regions 12P is used as a dielectric body. In the capacitor C2, the first semiconductor regions 11N(1) and 11N(2) are used as the other electrode, the semiconductor region 10P (silicon single crystal substrate) is used as one electrode. Another depletion layer is created between the first semiconductor regions 11N and the semiconductor region 10P as a dielectric body.

The first light emitting element 15(1) is essentially similar to the first light emitting element 15(1) of the first embodiment, and includes a buffer layer 151, a first electrode 152(1), a first active layer 153(1), a second electrode 154(2), and a conductive film 155 having optical transparency. The second light emitting element 15(2) includes: a buffer layer 151 in contact with the main surface 12S of the third semiconductor region 12P(2); a fourth electrode 154(4); and a conductive film 155 having the optical transparency. In short, the first light emitting elements 15 are essentially similar to the first light emitting elements 15 in the first embodiment.

The first electrode 152(1) of the first light emitting element 15(1) is electrically connected to first and second pads 172 and 171 via the buffer layer 151, second semiconductor region 12P(1), conductor 173, semiconductor region (silicon single crystal substrate) 10P, and rectifier 20.

The second semiconductor region 12P(1) made of p type silicon is in electric contact with the n type buffer region 151 of the first light emitting element 15(1). The third semiconductor region 12P(2) made of p type silicon is in electric contact with the n type buffer region 151 of the first light emitting element 15(2). The electric contact is the hetero junction, and alloyed regions are created at the contact areas of the foregoing components. When a forward voltage is applied to the first and second light emitting elements 15(1) and 15(2), a voltage drop at the hetero junction is small compared with a voltage drop at a hetero junction between n type silicon and n type buffer layer. The voltage drop at the hetero junction is approximately 4.0 V.

The connection between the first and second light emitting elements 15(1) and 15(2) is similar to the connection between the second and third light emitting elements 15(2) and 15(3), the connection between the third and fourth light emitting elements 15(3) and 15(4), and so on in the first embodiment. In other words, the first and second light emitting elements 15(1) and 15(2) constitute a unit element of the repeated arrangement pattern. The unit elements are repeatedly arranged between the first and second pads 172 and 171. Each light emitting element 15 is designed to be 30 µm long, for instance, considering light emitting efficiency resulting from miniaturization of cells in the second embodiment.

The second electrode 154(2) of the first light emitting element 15(1) is electrically connected by the conductor 17 to the third semiconductor region 12P(2) to which the third electrode 152(3) of the second light emitting element 15(2) is electrically connected. The conductor 17 is flush with the first and second pads 172 and 171 and a conductor 173, and is made of the material same as that of the first and second pads 172 and 171 and the conductor 173. One end of the conductor 17 is electrically connected to the second electrode 154(2) through a via hole 161 in an interlayer dielectric film 16. The other end of the conductor 17 is electrically connected to the main surface 12S of the third semiconductor region 12P(3) through a via hole 162. The fourth electrode 154(4) of the second light emitting element 15(2) and the fourth semiconductor region 12P(3) are electrically connected by the conductor 17 in the similar manner.

As shown in FIG. 6, FIG. 7 and FIG. 9, the forward diode BDf1 of the rectifier 20 uses, as a cathode electrode, an n type semiconductor region 11ND arranged on the main surface 10S of the semiconductor region 10P, and uses, as an anode electrode, the p type semiconductor region 12PD1 on the main surface 11S of the n type semiconductor region 11ND. The forward diode BDf2 uses, as a cathode electrode, the n type semiconductor region 11ND arranged on the main surface 10S of the semiconductor region 10P, and uses, as an anode electrode, a p type semiconductor region 12PD1 on the main surface 11S of the n type semiconductor region 11ND. In the second embodiment, the n type semiconductor region 11ND is fabricated in the fabricating process and under conditions same as those of the first semiconductor region 11N in the first embodiment. The anode electrode of the forward diode BDf1 and the cathode electrode of the reverse diode BDr1 are connected via the second pad 171 and the conductor 17 extending from the second pad 171.

The reverse diode BDr1 of the rectifier 20 uses, as an anode electrode, the semiconductor region 10P, and uses, as a cathode region, n type semiconductor region 11ND1 on the main surface 10S of the semiconductor region 10P. The reverse diode BDr2 uses, as an anode electrode, the semiconductor region 10P, and uses, as a cathode electrode, an n type semiconductor region 11ND2 on the main surface of the semiconductor region 10P. The n type semiconductor regions 11ND1 and 11ND2 are fabricated in the process and under conditions same as those of the first semiconductor regions 11N in the first embodiment. The anode electrode of the forward diode BDf2 and the cathode electrode of the reverse diode BDr2 are connected by the first pad 172 and the conductor 17.

[Planar Structure of Light Emitting Device]

With the light emitting device 1 of the second embodiment, the planar shape of the semiconductor region 10P is rectangular when viewed in the planar normal line direction to the main surface 10S of the semiconductor region 10P. Referring to FIG. 9, the forward diode BDf1 is positioned at an upper right corner where upper and right sides of the semiconductor region 10P meet. The second pad 171 is positioned on the forward diode BDf1. The forward diode BDf2 is positioned at a lower left corner where lower and left sides of the semiconductor region 10P meet. The first pad 172 is positioned on the forward diode BDf2. The reverse diodes BDr1 and BDr2 are positioned at a lower right corner where lower and right sides of the semiconductor region 10P meet. In short, the rectifier 20 extends from the upper right corner to the lower left corner via the lower right corner.

The light emitting elements 15(1) to 15(n) which are connected in series are positioned at the center of the semiconductor region 10P, and are repeatedly arranged in zigzags to the right and left. This is effective in minimizing connection lengths between adjacent light emitting elements 15, unifying the connection lengths, and reducing dead spaces.

Further, in the second embodiment, the light emitting elements 15(1) to 15(n) are arranged as an aggregate of minute cells as in the first embodiment, which improves the light emitting efficiency at the side surfaces of the light emitting elements 15.

[Light Emitting Operation of Light Emitting Device]

The light emitting operation of the light emitting device 1 will be described hereinafter. In the second embodiment, the light emitting device 1 includes 15 light emitting elements 15(1) to 15(n) which are connected in series.

The convenience plug 18 of the light emitting device 1 is putted into the convenience receptacle 101 connected to the power source (AC power source) 100 as shown in FIG. 6. The positive voltage is applied to the power source plug terminal 182 of the convenience plug 18 while the negative voltage is applied to the first power source plug terminal 181. Referring to FIG. 6 to FIG. 9, the current flows through the first pad 172, forward diode BDf2 of the rectifier 20, (n)th light emitting element 15(n), (n+1)th semiconductor region 12P(n+1), and conductor 17. Further, the current flows to the second power source plug 182 through the (n−1)th light emitting element 15(n−1), second semiconductor region 12P(n−1), conductor 17, . . . , light emitting element 15(1), second semiconductor region 12P(1), reverse diode BDr1, and second pad 171. In this state, the forward current flows through the light emitting elements 15(1) to 15(n), which emit light. The current from the first pad 172 does not flow to the reverse diode BDr2.

The positive voltage is applied to the first power source plug terminal 181 of the convenience plug 18 while the negative voltage is applied to the second power source plug terminal 182. The current flows through the second pad 171, forward diode BDf1 of the rectifier 20, (n)th light emitting element 15(n), (n+1)th semiconductor region 12P(n), and conductor 17. Further, the current flows to the first power source plug 181 through the (n−1)th light emitting element 15(n−1), (n)th semiconductor region 12P(n−1), conductor 17, . . . , first light emitting element 15(1), second semiconductor region 12P(1), reverse diode BDr2, and first pad 172. In this state, the forward current flows through the light emitting elements 15(1) to 15(n), which emit light. The current from the second pad 171 does not flow to the reverse diode BDr1.

Even if the power source 100 supplies the AC current, the light emitting device 1 continuously emits light because the rectifier 20 is provided. The first light emitting elements 15(1) to (n)th light emitting element 15(n) are connected in series. As long as the voltage V is applied between the first and second power source plug terminals 181 and 182, the voltage applied to the light emitting elements 15 is (voltage V)/(total number of light emitting elements). In this case, voltage variations in the light emitting elements 15 are not taken into consideration. If a relatively high voltage should be applied between the plug terminals 181 and 182, the number of light emitting elements to be connected in series has to be increased.

The voltage applied to the light emitting elements 15 can be adjusted by regulating density of impurities of the second semiconductor region 12P(1), third semiconductor region 12P(2), ..., and (n+1)th semiconductor region 12P(n), and by a varying resistance value of the resistors R, a capacitance value of the capacitors C1 and C2, and a threshold value of the forward diode Df and reverse diode Dr.

As described above, the light emitting device 1 of the second embodiment does not use any electronic components such as the voltage dividing circuit and power supply circuit, and can simply the structure. Further, in the light emitting element 1, the resistors 12R and so on are provided in the first semiconductor region 10N, so that no electronic components are required, which is effective in reducing a manufacturing cost. Still further, the light emitting device 1 can emit light immediately whenever it is connected to the battery unit or battery cells, or the commercial power source.

Third Embodiment

A third embodiment relates to a light emitting device 1 in which resistors having a simple structure are used in the light emitting device of the first or second embodiment.

[Circuit Configuration of Light Emitting Device]

Figure 10:
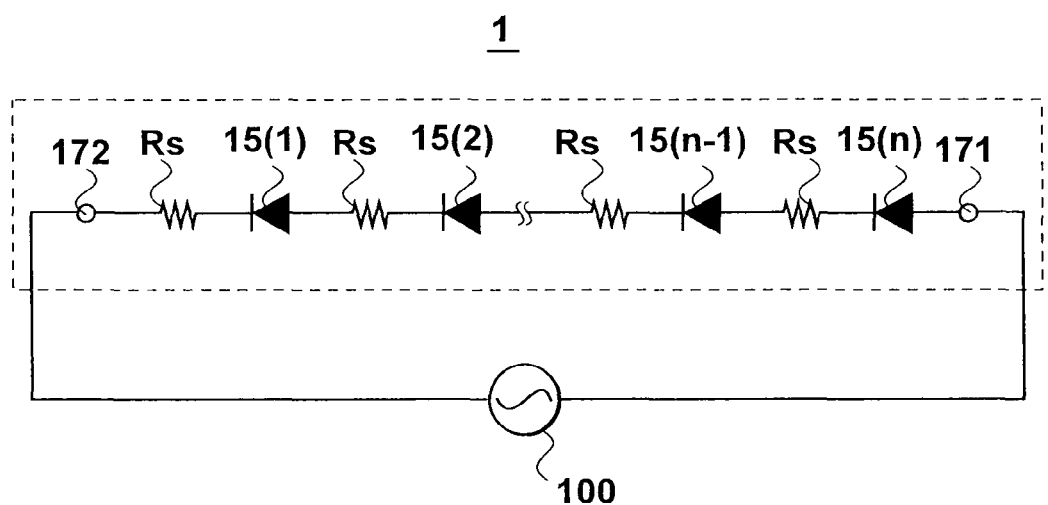
FIG. 10 is a circuit diagram of a light emitting device according to a third embodiment of the invention.

Referring to FIG. 10, the light emitting device 1 of this embodiment includes: a plurality of light emitting elements 15(1) to 15(n) which are electrically connected in series; a second pad 171 connected to an electrode (anode electrode) of the light emitting element 15(n) at the beginning; and a first pad 172 electrically connected to an electrode (cathode electrode) of the light emitting element 15(1) at the end. Further, the light emitting device 1 includes resistors Rs electrically connected to the cathode electrodes of the light emitting elements 15(1) to 15(n). Connections of the foregoing components are not referred to here. As in the first or second embodiment, the first and second pads 172 and 171 are electrically connected to a power source 100 via a convenience plug 18 and a power source plug terminal 101 (Refer to FIG. 2 and FIG. 6.). The power source 100 is the same as those of the foregoing embodiments.

[Device Structure of Light Emitting Device]

Figure 11:
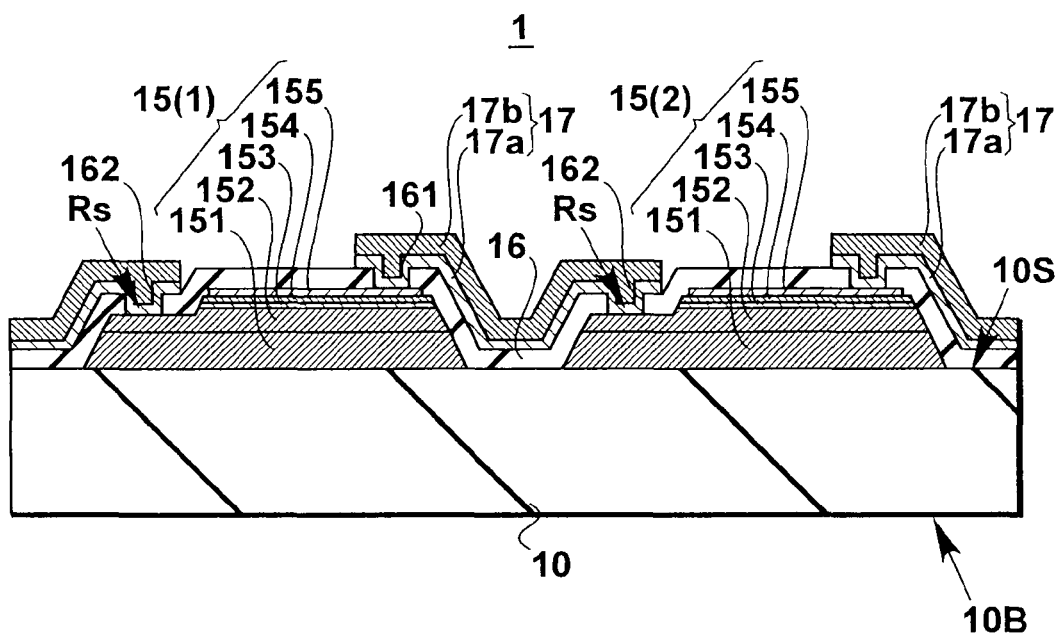
FIG. 11 is an enlarged cross sectional view of an essential part of the light emitting device of the third embodiment.
Figure 12:
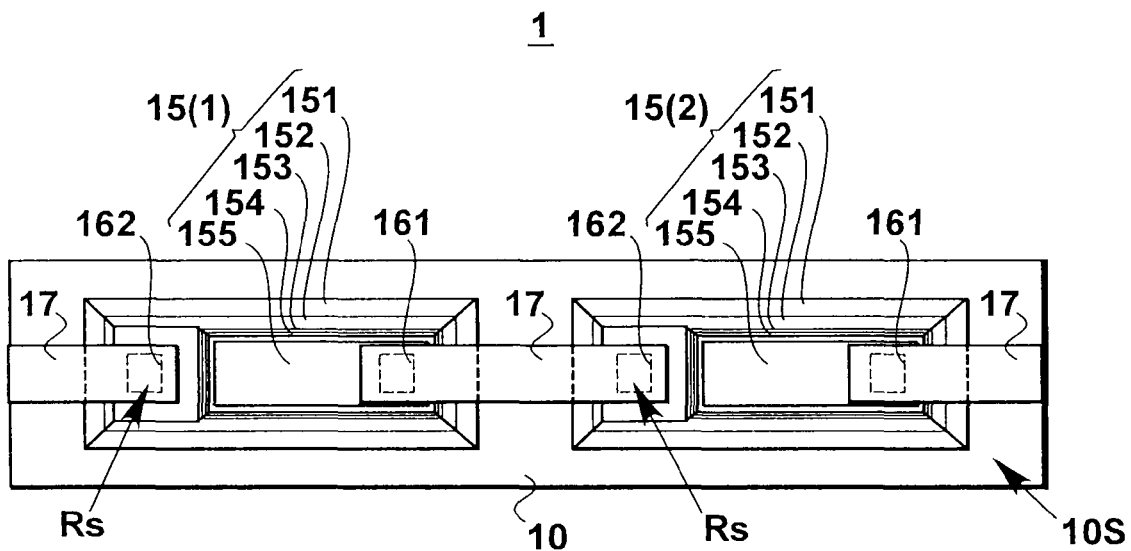
FIG. 12 is an enlarged top plan view of an essential part of the light emitting device of FIG. 11.

Referring to FIG. 11 and FIG. 12, the light emitting device 1 is specifically constituted by: a substrate 10; first electrodes 152 on the substrate 10; an active layer 153 on the first electrodes 152; second electrodes 154 on the active layer 153; a plurality of light emitting elements 15(1) to 15(n); and a conductor 17 connecting the first electrode 152 of the light emitting element 15(2), for instance, to the second electrode 154 of the light emitting electrode 15(1), for instance. The conductor 17 electrically connects the light emitting elements 15(1) to 15(n) in series, and has low resistance for the second electrode 154, and has the Shottkey effect with respect to the first electrodes 152.

In this third embodiment, the substrate 10 is a sapphire substrate which demonstrates excellent crystalline characteristics of an epitaxial layer on the main surface 10S. Alternatively, the substrate 10 may be an insulating substrate.

The first electrodes 152 of the light emitting elements 15 are placed on the substrate 10 via a buffer layer 151, and are made of an n type nitride semiconductor region, i.e. an n type GaN layer. The active layer 153 is made of MQW in order to constitute a double hetero junction LED. The MQW is the same as that used in the first embodiment. The second electrodes 154 are made of a p type semiconductor region, i.e. a p type GaN layer.

The conductor 17 has its one end electrically connected to the first electrodes 152 of the light emitting elements 15(1) to 15(n) and the other end electrically connected to the second electrodes 154 of the light emitting elements 15. The light emitting elements 15 are covered by an interlayer dielectric film 16. The conductor 17 has its opposite ends connected to the first electrode 152 and the second electrode 154 via holes 162 and 161 of the interlayer dielectric film 16. The interlayer film 16 is preferably made of a silicon oxide film. The other end of the conductor 17 and the second electrodes 154 are connected via an optically transparent conductive film 155, which is made of an ITO layer used as the optically transparent conductive film 155 in the first embodiment.

The conductor 17 is made of a conductive material having the Shottkey effect (non-ohmic chracteristics) with respect the first electrodes 152. The resisters Rs are created when the conductor 17 comes into contact with the first electrodes 152. In this embodiment, the conductor 17 includes a titanium layer 17a placed on the n type GaN layer used as a barrier metal layer, for instance, and a gold (Au) layer 17b on the titanium layer 17a.

The conductor 17 is fabricated as follows. First of all, the Ti layer is made to a thickness of 15 nm to 25 nm by the vapor deposition or spattering technology. The Ti layer is subject to the nitriding treatment for approximately one minute. Thereafter, a further Ti layer is made to a thickness of 15 nm to 25 nm by the vapor deposition or spattering technology. The Au layer having a thickness of 600 nm to 800 nm is made on the Ti layer by the vapor deposition or spattering technology. The Au layer is subject to the heat treatment at 350° C. for 5 to 10 minutes, so that the conductor 17 is completed. An etching mask is prepared by the photolithographic process. The conductor 17 is etched and patterned as predetermined using the etching mask.

The conductor 17 is connected to the first electrodes 152 of the light emitting elements 15, and the resistors Rs are created at the junctions between the conductor 17 and the first electrodes 152. The resistors Rs are provided for the light emitting elements 15(1) to 15(n) on one to one basis, and function as a series resistor, which enables the light emitting device 1 to cope with extensive variations of an AC voltage. When the first electrodes 152 of the light emitting elements 15 are made of the n type GaN layer, the conductor 17 constituted by the stacked Ti and Al layers in order to demonstrate excellent ohmic characteristics is used for the n type GaN layer. Since substantially no resistance component is applied to the junctions between the conductor 17 and the light emitting elements 15, the current (I)-voltage (V) characteristics are excellent. When the power source 100 connected to the light emitting device 1 supplies the DC power, the I-V characteristics are excellent.

However, when the power source 100 supplies the AC power, e.g. 100 V home electrical power, to the light emitting device 1, the AC power has a variable voltage. Specifically, when the power source 100 supplies the 100 V power, a maximum voltage 140 V will be actually supplied to the light emitting device 1. In such a case, a large current will flow to the light emitting device 1, which may be subject to thermal destruction. In order to overcome this problem, a high resistance element (an external resistance element) is usually used for the light emitting device 1.

In the third embodiment, the resistors Rs are used for the light emitting device 1 without using the external resistor in order to enable the light emitting device 1 to reliably emit light even if the power source 100 supplies the AC power having the voltage of 100 V to a maximum voltage of 140 V. The resistors Rs are provided for the light emitting elements 15 on one to one basis, so that the forward voltage can be increased by an amount of the Shottkey voltage for each of the light emitting elements 15, and it is possible to suppress an abrupt increase of the voltage.

Figure 13:
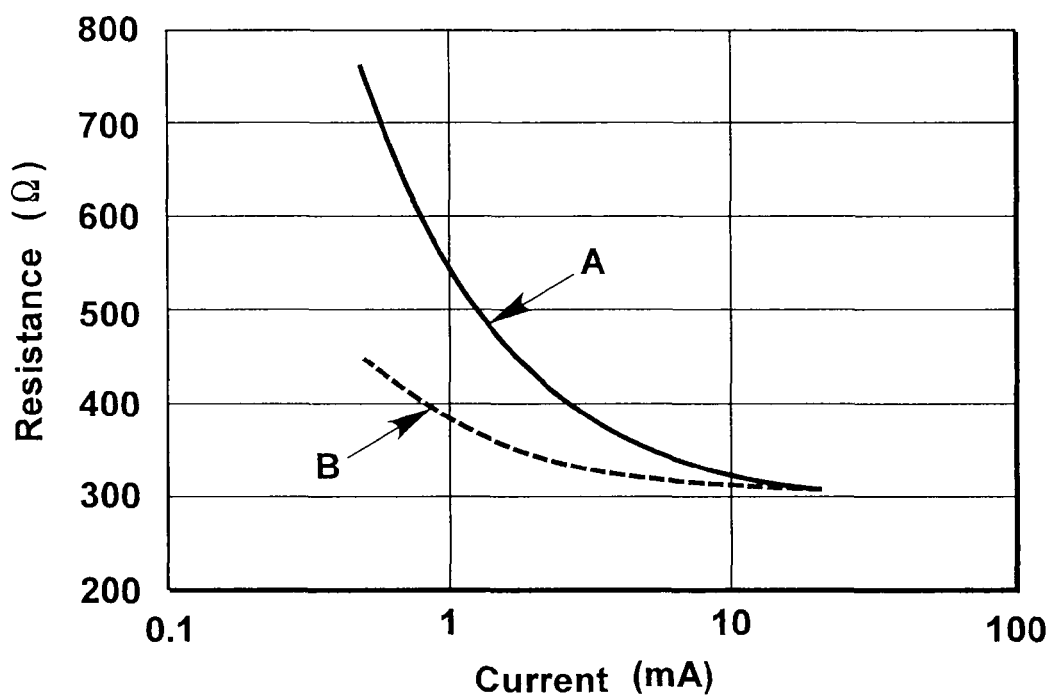
FIG. 13 is a graph showing the relationship between resistance and current in resistors of the light emitting device of the third embodiment.

As shown in FIG. 13, the light emitting device 1 has to be operated in a low voltage range in order to accomplish the foregoing effect. In FIG. 13, the ordinate denotes a resistance value (Q) of the resistors Rs while the abscissa denotes a current value (mA). Curve A denotes characteristics of the resistors Rs when the conductor 17 is made of the conductive material (stacked Ti layer 17a and Au layer 17b). Curve B relates to a comparison example of a resistor when a conductor is made of a conductive material having ohmic characteristics such as stacked Ti and Al layers.

In a high current range of 10 mA or higher as shown in FIG. 13, the resistance value of the resistors Rs of the present invention remains substantially invariable even if the current value in the resistors Rs varies (e.g. increases). This holds true to the resistor of the comparison example. In a low current range of 10 mA or lower, the resistors Rs extensively increase the resistance value in response to a decrease of the current value, compared to the resistor of the comparison example. In short, it is possible to increase the resistance value of the resistors Rs in the low current range. Further, the light emitting element 15 made of a nitride semiconductor can effectively emit light at a low current of 10 mA or lower. Therefore, the light emitting device 1 of the third embodiment can improve the light emitting efficiency of the light emitting elements 15. In the light emitting device 1 of this third embodiment, in order to accomplish a high resistance value of the resistors Rs, the Shottoky junction area is enlarged while a light emitting area is minimized. For instance, the light emitting elements 15 are designed to be actuated by a current which is equal to or less than 10 mA, specifically 1 mA or less, when the voltage range is 90 V to 140 V.

[Planar Structure of Light Emitting Device]

With the light emitting device 1 of this embodiment, the first pad 172 is positioned at the lower right corner on the main surface 10S of the substrate 10, when viewed in the planar direction of the substrate 10, while the second pad 171 is positioned at the upper left corner which is diagonal to the lower right corner.

Figure 14:
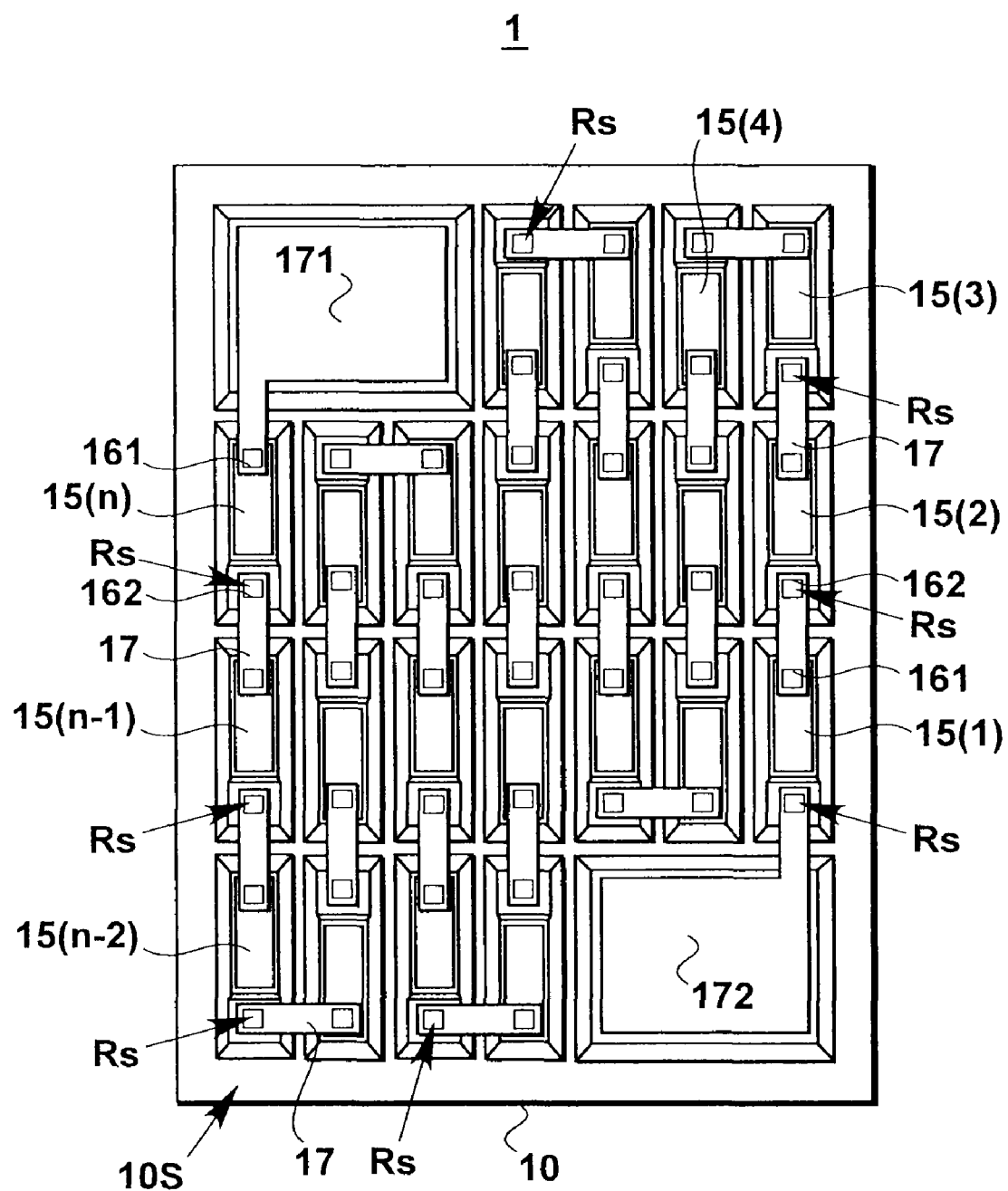
FIG. 14 is a top plan view of the light emitting device of the third embodiment.

Referring to FIG. 11, FIG. 12 and FIG. 14, each light emitting element 15 is placed on the main surface 10S of the substrate 10, and includes the buffer layer 151, first electrode 152, second electrode 153 and optically transparent conductive film 155 which are stacked one over another. Each light emitting element 15 is in the shape of an island, and is separated from its adjacent light emitting elements 15. The island is rectangular. The conductor 17 is connected to the optically transparent conductive film 155 which is exposed via the hole 161 of the interlayer dielectric film 16 and is present at one end of the island. At the other end of the island, the optically transparent conductive film 155, second electrode 154, active layer 153 and first electrode 152 are partially removed. The conductor 17 is connected to the first electrode 152 which is exposed via the hole 162 of the interlayer dielectric film 16 of the removed part.

The first electrode 152 of the light emitting element 15(1) is connected to the first pad 172 via the conductor 17. In this third embodiment, the conductor 17 and the first pad 172 are flush with each other, and are made of the same conductive material. As shown in FIG. 14, the light emitting elements 15(1) to 15(3) are sequentially arranged from the lower right corner to the upper right corner. The light emitting elements 15(4) to 15(6) are folded back to the left, and are sequentially arranged from the upper right corner to the lower right corner. The light emitting elements 15(7) to 15(9) are folded back to the left, and arranged from the lower right corner to the upper right corner. The light emitting elements 15(10) to 15(n−3) are folded back to the left and are sequentially arranged. The light emitting elements 15(n−2) to 15(n) are sequentially arranged from the lower left corner to the upper left corner. The second electrode 154 of the light emitting element 15(n) is connected to the second pad 171 via the conductor 17. The conductor 17 and the second pad 171 are flush with each other, and are made of the same conductive layer. In other words, the light emitting elements 15(1) to 15(n) are arranged in zigzags to the left and right, and are longitudinally folded back.

A nitride semiconductor which is similar to the first electrode 152 is preferably provided between the substrate 10 and the first electrode 152 under the first and second bonding pads 172 and 171. The current leakage from the first pad 172 and second pad 171 to the substrate 10 can be prevented, when the pin-hole arose in the interlayer dielectric film 16 of right under of the first pad 172 and second pad 171.

The light emitting device 1 of third embodiment is as effective as the light emitting device 1 of the first embodiment. The resistors Rs are connected in series for the light emitting elements 15(1) to 15(n), so that the light emitting device 1 can reliably emit light even when the AC power supplied by the power source 100 has a variable voltage. The resistors Rs are effective in preventing the light emitting device 1 from being subject to thermal destruction even if a large AC voltage is applied.

The resistors Rs are arranged between the junctions between the first electrodes 152 of the light emitting elements 15 and the conductor 17, so that the light emitting device 1 can be made compact even if the resistors Rs are provided.

In the light emitting device 1, the light emitting elements 15(1) to 15(n) are arranged in zigzags, which is effective in minimizing wire connections between adjacent light emitting elements, equalizing a length of the wire connections, and preventing dead spaces.

When fabricating the light emitting device 1, the conductor 17 is made of the conductive material demonstrating the Shottkey effect with respect to the first electrodes 152. Further, the conductor 17 and the first and second electrodes 152 and 154 of the light emitting elements 15 are flush with one another, and are simultaneously made of the same conductive material. Therefore, the resistors Rs can be formed with ease in a simple manner.

The conductor 17 constituting the resistors Rs includes the stacked Ti layer 17a and Au layer 17b. Alternatively, the conductor 17 may made of stacked Ti layer, Ni layer and Au layer, stacked Ti layer, TiN layer and Au layer, stacked Ti layer, Ge layer and Au layer, stacked Ti layer, Zn layer and Au layer, and so on.

The light emitting elements 15 have a rectangular profile. Alternatively, the light emitting elements 15 may have a circular profile, an oval profile, a triangular profile, a pentagonal profile, or a polygonal profile.

Modified Example 1

In a modified example 1, the light emitting device 1 includes either the first pad 172 or the second pad 171 positioned on a rear surface (10B shown in FIG. 11) of the substrate 10.

Figure 15:
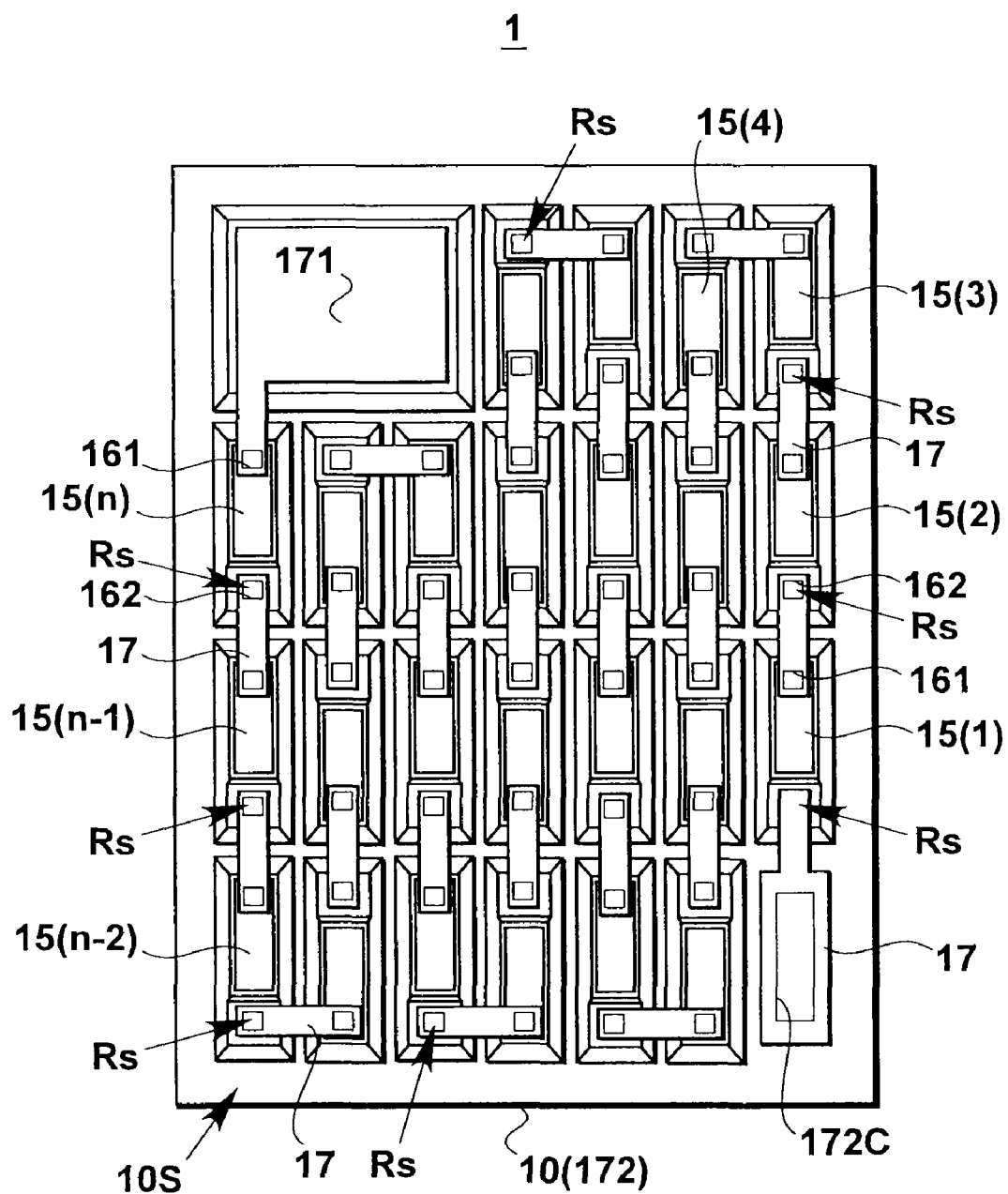
FIG. 15 is a top plan view of a light emitting device in a first modified example of the third embodiment.

Referring to FIG. 15, the conductor 17 has its one end connected to the first electrode 152 of the light emitting element 15(1) and the other end thereof connected to a connector 172C of the substrate 10. The rear surface 10B of the substrate 10 is used as the second electrode 172. In this case, the substrate 10 is a mono-crystalline silicon substrate which is conductive and assures crystal growth of the active layer 153 of the light emitting elements 15.

The main surface 10S of the substrate 10 may be used as the connector 172C. However, in order to accomplish an ohmic connection of the conductor 17 and the substrate 10, the connector 172C is preferably made of a semiconductor region (diffused region) which has the conductivity type same as that of the substrate 10 and has a high impurity concentration compared with an impurity concentration of the substrate 10. The rear surface 10B of the substrate 10 may be used as the first pad 172. In this case, a metal film such as an Au film or the like may be provided on the rear surface 10B. The metal film may be substantially used to constitute the first pad 172.

In the light emitting device 1, the substrate 10 is used to constitute the first pad 172, so that the number of light emitting elements 15 can be increased. When the number of light emitting elements 15 is not increased, the light emitting device 1 can be downsized.

The conductor 17 constituting the resistors Rs includes not only the Au layer 17b but also the Ti layer 17a. The Ti layer 17a functions as a barrier metal, and prevents thermal diffusion of the Au layer 17b at the connector 175C to the substrate 10.

In the modified example 1, the first pad 172 is constituted by the substrate 10. Alternatively, the second pad 171 may be constituted by the substrate 10.

Modified Example 2

Figure 16:
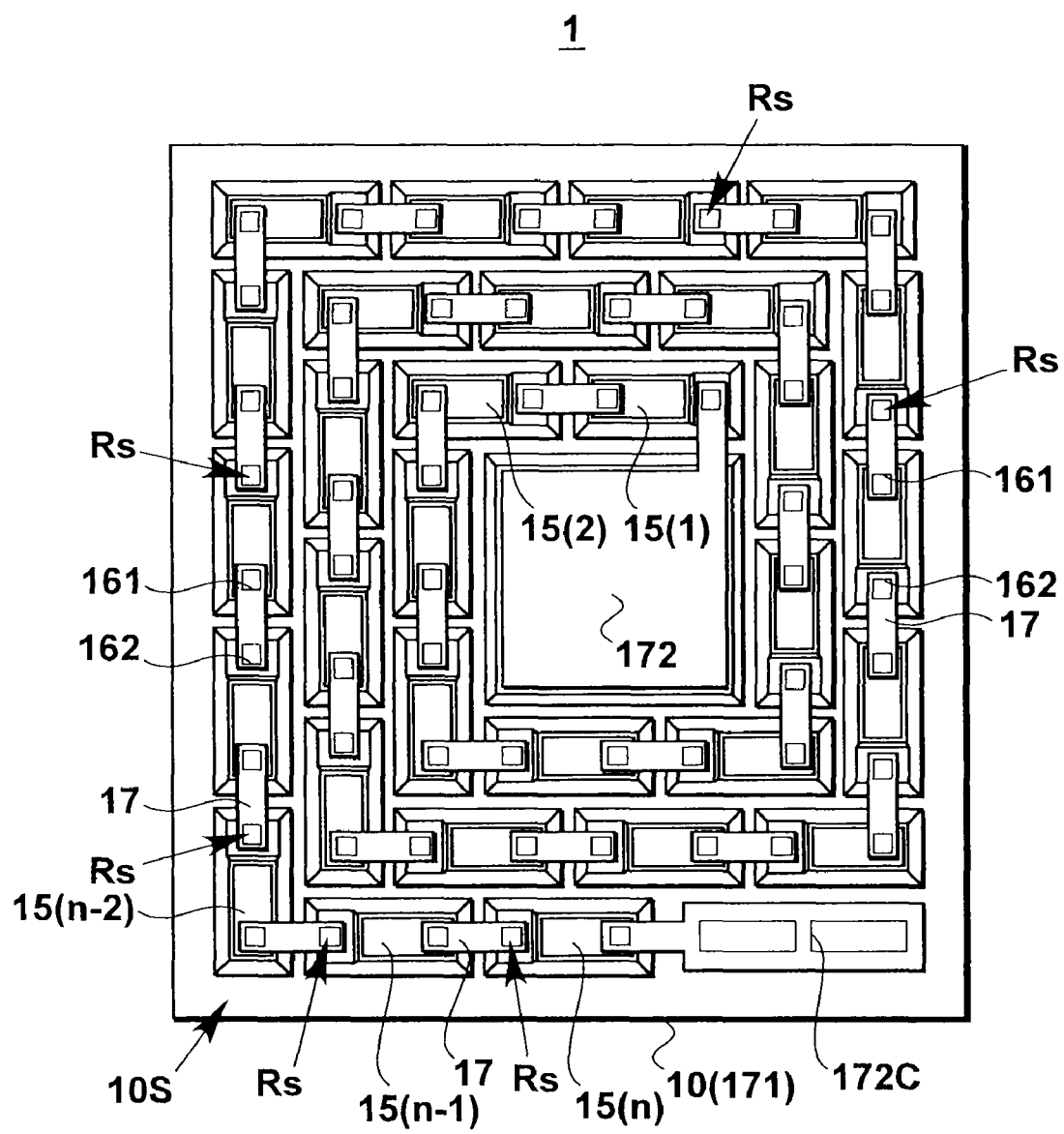
FIG. 16 is a top plan view of a light emitting device in a second modified example of the third embodiment.

In the modified example 2, the light emitting device 1 of the modified example 1 is used in combination with the light emitting device 1 of the first embodiment shown in FIG. 3. Referring to FIG. 16, in the light emitting device 1 of the modified example 2, the light emitting element 15(1), light emitting element 15(2), light emitting element 15(3), ... light emitting element 15(n) are spirally and sequentially arranged around the first pad 172 which is at the center. In this example, the conductor 17 has its one end connected to the second electrode 154 of the light emitting element 15(n), and the other end thereof connected to the connector 171C of the substrate 10. Further, the rear surface 10B of the substrate 10 is used as the second pad 171.

The light emitting device 1 of the modified example 2 is as effective as not only the light emitting device 1 of the first embodiment but also as the light emitting device 1 of the modified example 1.

Fourth Embodiment

In a fourth embodiment of the invention, a light emitting device is substantially identical to the light emitting device of the third embodiment, and includes further elements in order to improve ESD (electro-static discharge) withstand voltage.

[Circuit Configuration of Light Emitting Device]

Figure 17:
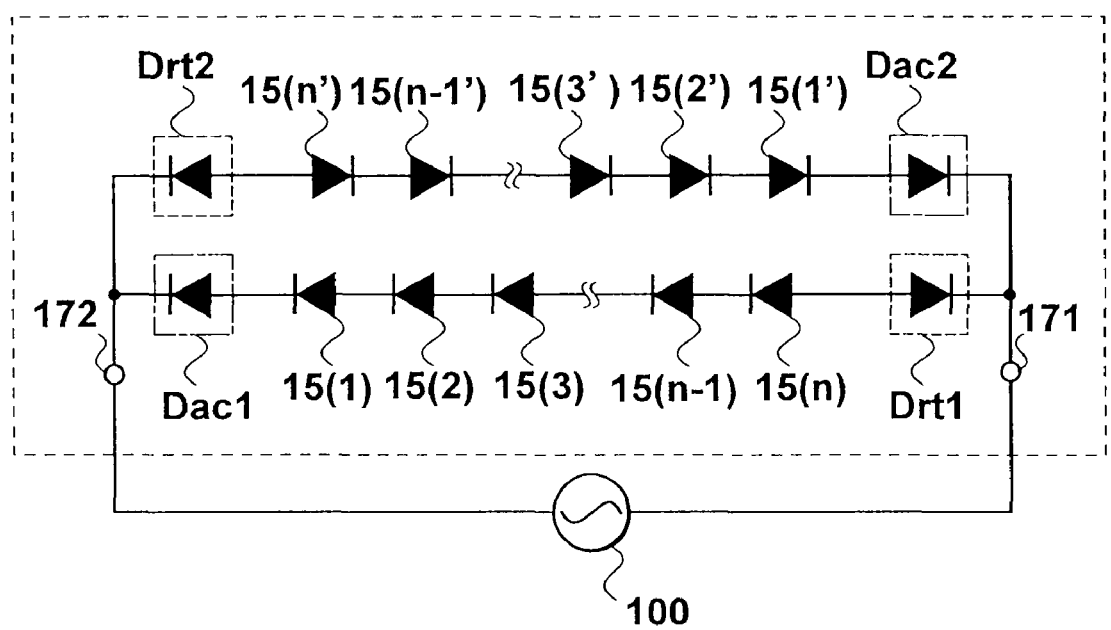
FIG. 17 is a circuit diagram of a light emitting device according to a fourth embodiment.

Referring to FIG. 17, the light emitting device 1 includes: a plurality of light emitting elements 15(1) to 15(n) which are electrically connected in series; a plurality of light emitting elements 15(1') to 15(n') which are electrically connected in series in a direction opposite to the direction of the light emitting elements 15(1) to 15(n); a second pad 171 connected to an anode electrode of the light emitting element 15(n) and to a cathode electrode of the light emitting element 15(1'); a first pad 172 connected to a cathode electrode of the light emitting element 15(1) and to an anode electrode of the light emitting element 15(n'). Further, the light emitting device 1 includes: a reverse withstand voltage element Drt1 between the light emitting element 15(n) and the second pad 172; a reverse withstand voltage element Drt2 between the light emitting element 15(n') and the first pad 172. The reverse withstand voltage element Drt1 has a polarity opposite to that of the light emitting elements 15(1) to 15(n). The reverse withstand voltage element Drt2 has a polarity opposite to that of the light emitting elements 15(1') to 15(n'). The light emitting elements 15(1) to 15(n) and 15(1') to 15(n') are electrically connected in parallel to the power source 100. The light emitting device 1 operates on the AC voltage, and emits light.

The reverse withstand voltage element Drt1 is electrically connected in series between the light emitting element 15(n) and the second pad 171, and prevents a surge from flowing to the light emitting element 15(n) from the second pad 171. In the similar manner, the reverse withstand voltage element Drt2 is electrically connected in series between the light emitting element 15(n') and the first pad 172, and prevents a surge from flowing to the light emitting element 15(n') from the first pad 172. In other words, the reverse withstand voltage elements Drt1 and Drt2 are used to improve the ESD withstand voltage.

In the fourth embodiment, the light emitting device 1 includes a backflow preventing element Dac1 positioned between the cathode electrode of the light emitting element 15(1) and the first pad 172, and a backflow preventing element Dac2 positioned between the cathode electrode of the light emitting element 15(1').

The backflow preventing element Dac1 is oriented so that it has a polarity same as that of the light emitting elements 15(1) to 15(n). The backflow preventing element Dac2 is oriented so that it has a polarity same as that of the light emitting elements 15(1') to 15(n'). When a voltage applied to the first pad 172 is higher than a voltage applied to the second pad 171, the current flowing to the light emitting elements 15(1') to 15(n') passes through the reverse withstand voltage element Drt2. Since quantities of the light emitting elements 15(1) to 15(n) and light emitting elements 15(1) to 15(n') are the same, the current might flow to the light emitting elements 15(1) to 15(n). The backflow preventing element Dac1 prevents the surge from flowing to the light emitting element 15(1) to 15(n) while the reverse withstand voltage withstand voltage element Drt2 prevents the surge from flowing to the light emitting elements 15(1') to 15(n'). Similarly, the backflow preventing element Dac2 prevents the surge from flowing to the light emitting element 15(1') to 15(n') while the reverse withstand voltage element Drt1 prevents the surge from flowing to the light emitting elements 15(1) to 15(n).

[Structure of Light Emitting Device: Reverse Withstand Voltage Elements]

Figure 18:
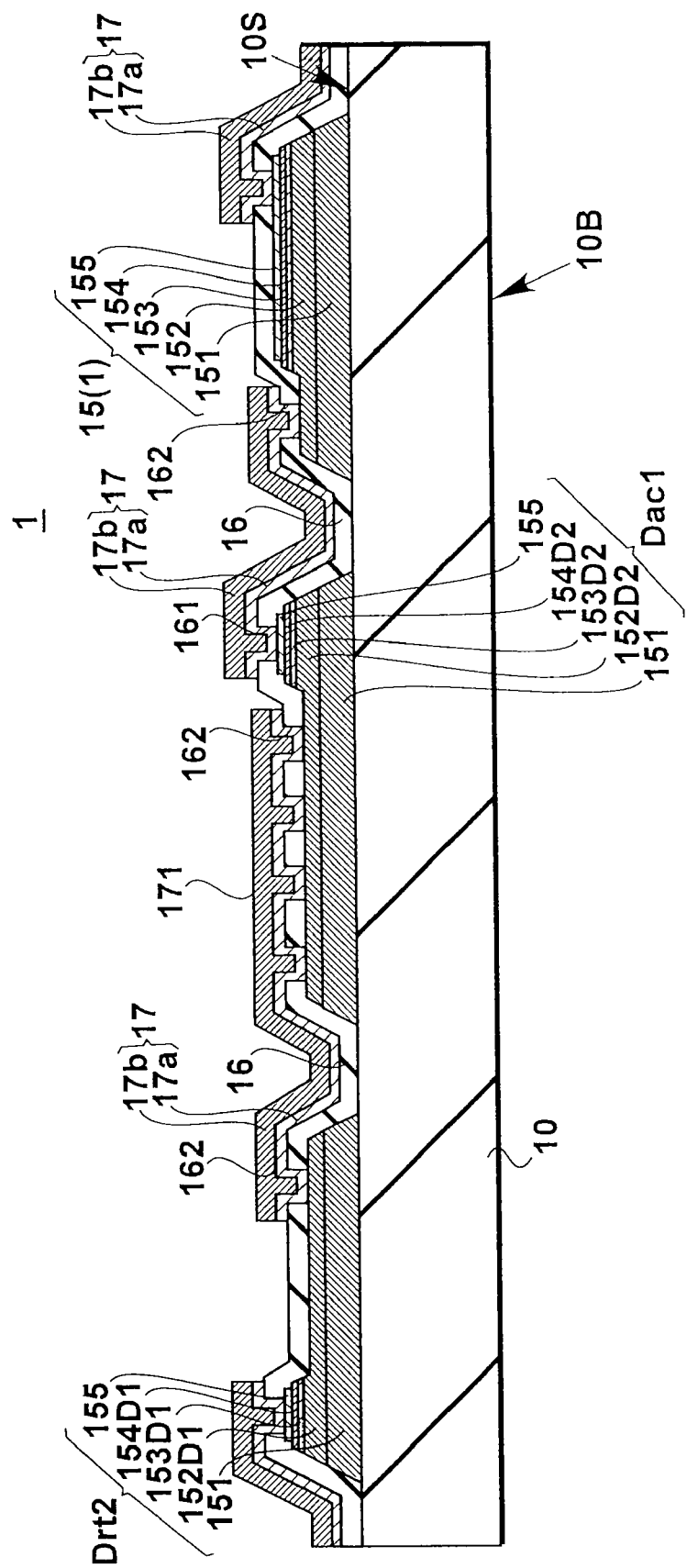
FIG. 18 is an enlarged cross sectional view of an essential part of the light emitting device of the fourth embodiment, taken along line F17-F17 in FIG. 19.
Figure 19:
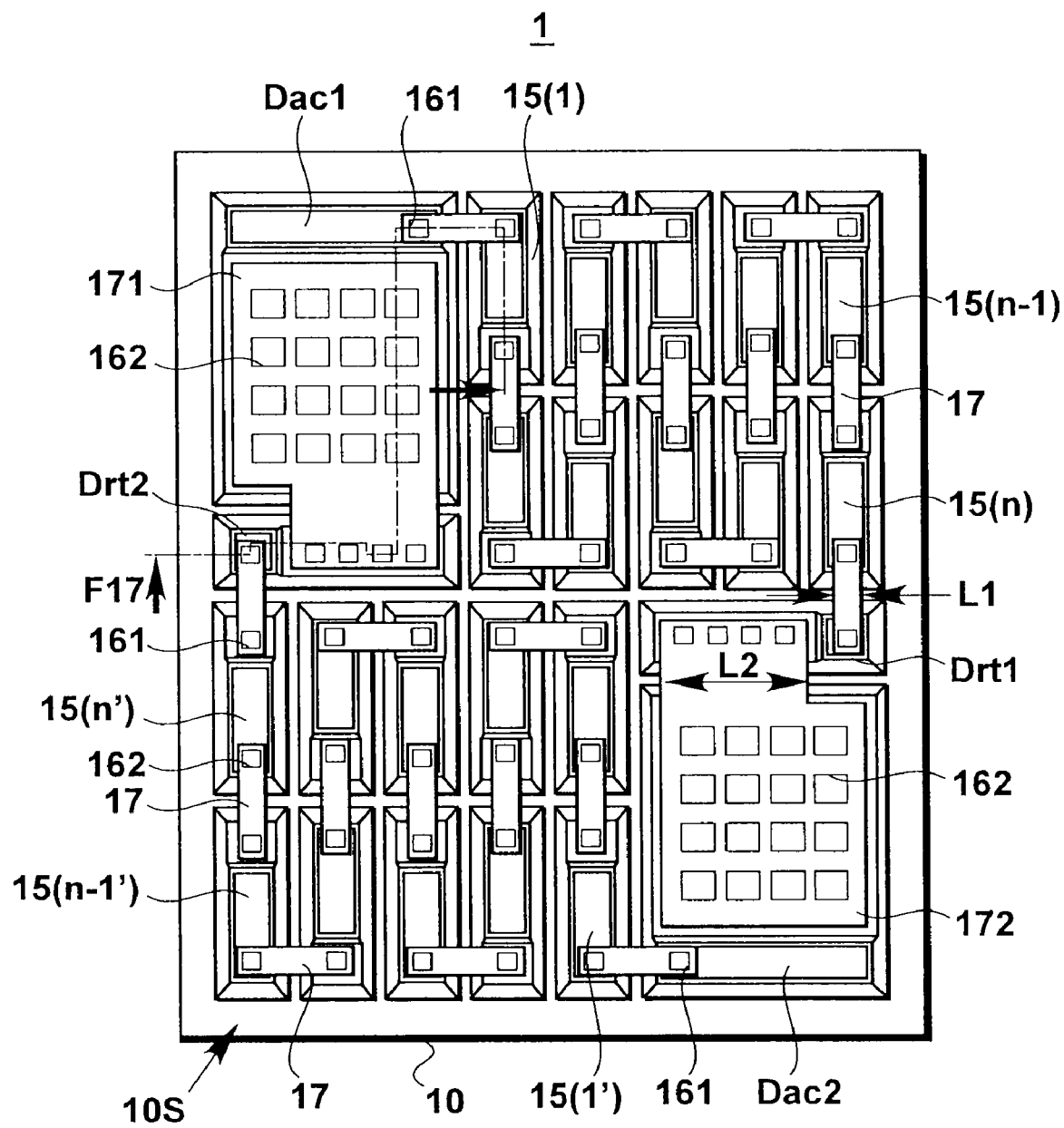
FIG. 19 is a top plan view of the light emitting device of the fourth embodiment.
Figure 20:
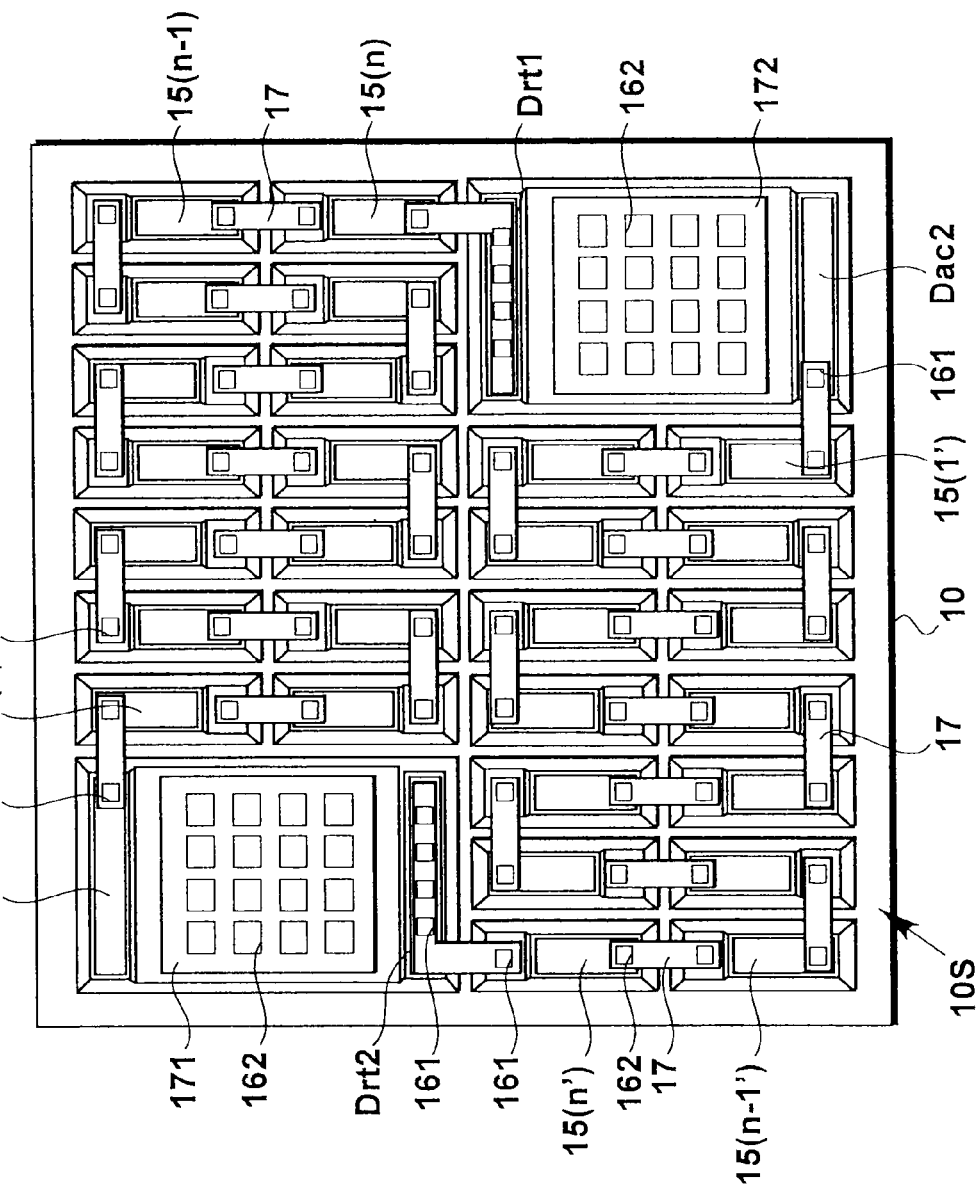
FIG. 20 is a top plan view of a light emitting device in modified example 1 of the fourth embodiment.

Referring to FIG. 18 and FIG. 19, the light emitting device 1 of this fourth embodiment is essentially similar to the light emitting device 1 of the first embodiment, and includes: the substrate 10; first electrodes 152; active layer 153; second electrodes 154; light emitting elements 15(1) to 15(n) and 15(1') to 15(n') positioned on the substrate 10; reverse withstand voltage element Drt2 electrically connected in series between the first electrode 152 of the light emitting element 15(n') and the first pad 172 on the main surface 10S of the substrate 10, and having a first electrode 152D1 flush with the first electrode 152, an active layer 153D1 flush with the active layer 153, and a second electrode 154D1 flush with the second electrode 154; and reverse withstand voltage element Drt1 electrically connected in series between the first electrode 152 of the light emitting element 15(n) and the second pad 171 on the main surface 10S of the substrate 10, and having a first electrode 152D1 flush with the first electrode 152, an active layer 153D1 flush with the active layer 153, and a second electrode 154D1 flush with the second electrode 154.

The substrate 10, buffer layer 151, first electrodes 152, active layer 153, second electrode 154, optically transparent conductive film 155, interlayer dielectric film 16, and conductor 17 are similar to those in the third embodiment, and are not referred to here.

The reverse withstand voltage elements Drt1 and Drt2 are connected in a direction opposite to the direction of the light emitting elements 15, but have the cross sectional structure which is similar to that of the light emitting elements 15. The reverse withstand voltage elements Drt1 and Drt2 are diodes having the p-i (intrinsic)-n type structure, since the first electrode 152D1 is made of an n type GaN layer, the active layer 153D1 is made of a nitride semiconductor region having the MQW structure, and the second electrode 154D1 is made of a p type GaN layer.

The reverse withstand voltage elements Drt1 and Drt2 are in the shape of islands similarly to the light emitting elements 15, and are placed on the main surface 10S of the substrate 10 via the buffer layer 151. The first electrodes 152D1 of the reverse withstand voltage elements Drt1 and Drt2 are electrically connected to the conductor 17 via the hole 162 of the interlayer dielectric film 16. The second electrodes 154D1 are electrically connected to the conductor 17 via the hole 161 of the interlayer dielectric film 161. The optically transparent conductive film 155 is provided between the second electrodes 154D1 and the conductor 17. The optically transparent conductive film 155 may be independent from the reverse withstand voltage elements Drt1 and Drt2. The conductor 17 is constituted by the stacked Ti layer and Au layer, similarly to the conductor 17 of the third embodiment.

The reverse withstand voltage elements Drt1 and Drt2 and light emitting elements 15 are in the shape of islands which have wide bottoms on the substrate 10 and narrow tops near the optically transparent conductive film 155. The side surfaces of the islands are sloped. An angle between the bottoms and tops of the islands is designed to be 40 degrees to 70 degrees in order to prevent breakdown of the conductor 17. When the side surfaces are sloped with the foregoing angles, referring to FIG. 5, it is possible to reduce light reflected from the side surface of the light emitting elements 15, and a sufficient amount of light can be emitted. The sloped side surfaces can be easily formed by the mesa—etching process.

The reverse withstand voltage elements Drt1 and Drt2 in the island shape are larger than the light emitting elements 15. The conductor 17 for connecting the first pad 172 and the reverse withstand voltage element Drt2 has a width L2 which is larger than a width L1 of the conductor 17 for connecting the light emitting elements 15. This is to prevent the light emitting elements 15 from being thermally damaged due to the surge.

In the light emitting device 1 shown in FIG. 19, the first pad 172 is positioned at the lower right corner while the second pad 171 is at the upper left corner which is diagonal to the lower right corner, when observed in the planar direction of the main surface 10S of the substrate 10. The light emitting elements 15(1) to 15($n$) are at the upper right of the substrate 10, and are arranged in zigzags in the manner similar to that of the light emitting device of the third embodiment. The light emitting elements 15(1') to 15($n'$) are positioned at the lower left of the substrate 10, are arranged in zigzags, and are 180 degrees point symmetrical about the center of the substrate 10. In short, the light emitting elements 15 are arranged even out.

The reverse withstand voltage element Drt1 is positioned between the first pad 172 and the light emitting elements 15(1) to 15($n$), at the right center of the substrate 10. The reverse withstand voltage element Drt2 is positioned between the second pad 171 and the light emitting elements 15(1') to 15($n'$), at the left center of the substrate 10.

As described above, the light emitting device 1 of this fourth embodiment is effective as the light emitting device 1 of the third embodiment, and includes the following: the reverse withstand voltage element Drt1 which has the structure similar to that of the light emitting elements 15 and which is positioned between the second pad 171 and the light emitting element 15($n$); and the reverse withstand voltage element Drt2 which is positioned between the first pad 172 and the light emitting element 15($n'$). No external protecting elements are used, which is effective in downsizing the light emitting device 1, and improving the ESD withstand voltage.

The reverse withstand voltage elements Drt1 and Drt2 are made of nitride semiconductor diodes in place of silicon diodes, and do not change their property in response to the light emitting operation, and assure stable ESD withstand voltages. Further, the reverse withstand voltage elements Drt1 and Drt2 have the p-i-n type structure, and are slow to generate parasitic capacitance compared to the silicon diodes.

In the fourth embodiment, the reverse withstand voltage element Drt1 is positioned near the light emitting elements 15(1) to 15($n$) while the reverse withstand voltage element Drt2 is positioned near the light emitting elements 15(1') to 15($n'$). Alternatively, either the reverse withstand voltage element Drt1 or Drt2 may be omitted if flicker is negligible.

[Structure of Light Emitting Device: Backflow Preventing Element]

Referring to FIG. 18 and FIG. 19, the light emitting device 1 further includes the backflow preventing elements Dac1 and Dac2, which have the first electrodes 152D2 flush with the first electrodes 152 of the light emitting elements 15, active layer 153D2 flush with the active layer 153, and second electrode 154D2 flush with the second electrode 154.

The backflow preventing elements Dac1 and Dac2 are connected in the direction same as that of the light emitting elements 15, and have the cross sectional structure similar to that of the light emitting elements 15. The backflow preventing elements Dac1 and Dac2 are diodes having the p-i-n type structure, since the first electrode 152D2 is made of an n type GaN layer, the active layer 153D2 is made of a nitride semiconductor region having the MQW structure, and the second electrode 154D2 is made of a p type GaN layer.

The backflow preventing elements Dac1 and Dac2 are in the shape of islands similarly to the light emitting elements 15, and are placed on the main surface 10S of the substrate 10 via the buffer layer 151. The backflow preventing element Dac1 substantially overlaps on the second pad 171, and functions as a seat of the second pad 171. Similarly, the backflow preventing element Dac2 substantially overlaps on the first pad 172, and functions as a seat of the first pad 172.

The first electrodes 152D2 of the backflow preventing elements Dac1 and Dac2 are electrically connected to the conductor 17 via the holes 162 of the interlayer dielectric film 16. The conductor 17 functions as the second pad 171 on the island region of the backflow preventing element Dac1, and functions as the first pad 172 on the island region of the backflow preventing element Dac2. Since the surge may flow to the backflow preventing elements Dac1 and Dac2, the number of the holes 162 is more than the number of the holes 162 in the light emitting elements 15 in order to alleviate current concentration and to reduce contact resistance. Further, the holes 162 for the backflow preventing elements Dac1 and Dac2 are larger than the holes 162 of the light emitting elements 15. No restrictions are placed on the number and planar shape of the holes 162. The holes 162 for the backflow preventing elements Dac1 and Dac2 are required only to prevent the backflow of the surge.

The second electrodes 154D2 of the backflow preventing elements Dac1 and Dac2 are electrically connected to the conductor 17 via the holes 161 of the interlayer dielectric film 16. The optically transparent conductive film 155 is positioned between the second electrode s154D2 and the conductor 17. The optically transparent conductive film 155 may be independent from the backflow preventing elements Dac1 and Dac2.

Referring to FIG. 19, in the light emitting device 1, the backflow preventing element Dac2 is positioned at the lower right corner between the lower end of the substrate 10 and the first pad 172 on the main surface 10S of the substrate 10 while the backflow preventing element Dac1 is positioned at the upper left corner between the upper end of the substrate 10 and the second pad 171 on the main surface 10S of the substrate 10.

As described above, the light emitting device 1 of this fourth embodiment is effective as the light emitting device 1 of the third embodiment, and includes the following: the backflow preventing element Dac1 which has the structure similar to that of the light emitting elements 15 and which is positioned between the second pad 171 and the light emitting element 15(1); and the backflow preventing element Dac2 which is positioned between the first pad 172 and the light emitting element 15(1'). No external protecting elements are used, which is effective in downsizing the light emitting device 1, and preventing the backflow of the surge.

The substrate 10 may be an insulating substrate, a sapphire electrode which transmit light from the light emitting elements 15, or the like.

Modified Example 1

In a modified example 1 of the fourth embodiment, the island region which is used as the seat for the first pad 172 and serves as the backflow preventing element Dac2 is shared by the reverse withstand voltage element Drt1 while the island region which is used as the seat for the second pad 171 and serves as the backflow preventing element Dac2 is shared by the reverse withstand voltage element Drt2. In short, the reverse withstand voltage element Drt1 overlaps on the first pad 172 while the reverse withstand voltage element Drt2 overlaps on the second pad 171.

Since the first pad 172 can be effectively used and the reverse withstand voltage element Drt1 can be enlarged, it is possible to assure a sufficient space for connecting the first electrode 152D1 of the reverse withstand voltage element Drt1 and the first pad 172. Similarly, since the second pad 171 can be effectively used and the reverse withstand voltage element Drt2 can be enlarged, it is possible to assure a sufficient space for connecting the first electrode 152D1 of the reverse withstand voltage element Drt2 and the second pad 171. Therefore, it is possible to sufficiently protect the reverse withstand voltage elements Drt1 and Drt2 against the thermal destruction and ESD.

Modified Example 2

In a second modified example, a light emitting device 1 is a combination of the light emitting device 1 of the modified example 1 of the third embodiment, and the light emitting device 1 of the fourth embodiment (see FIG. 14).

Figure 21:
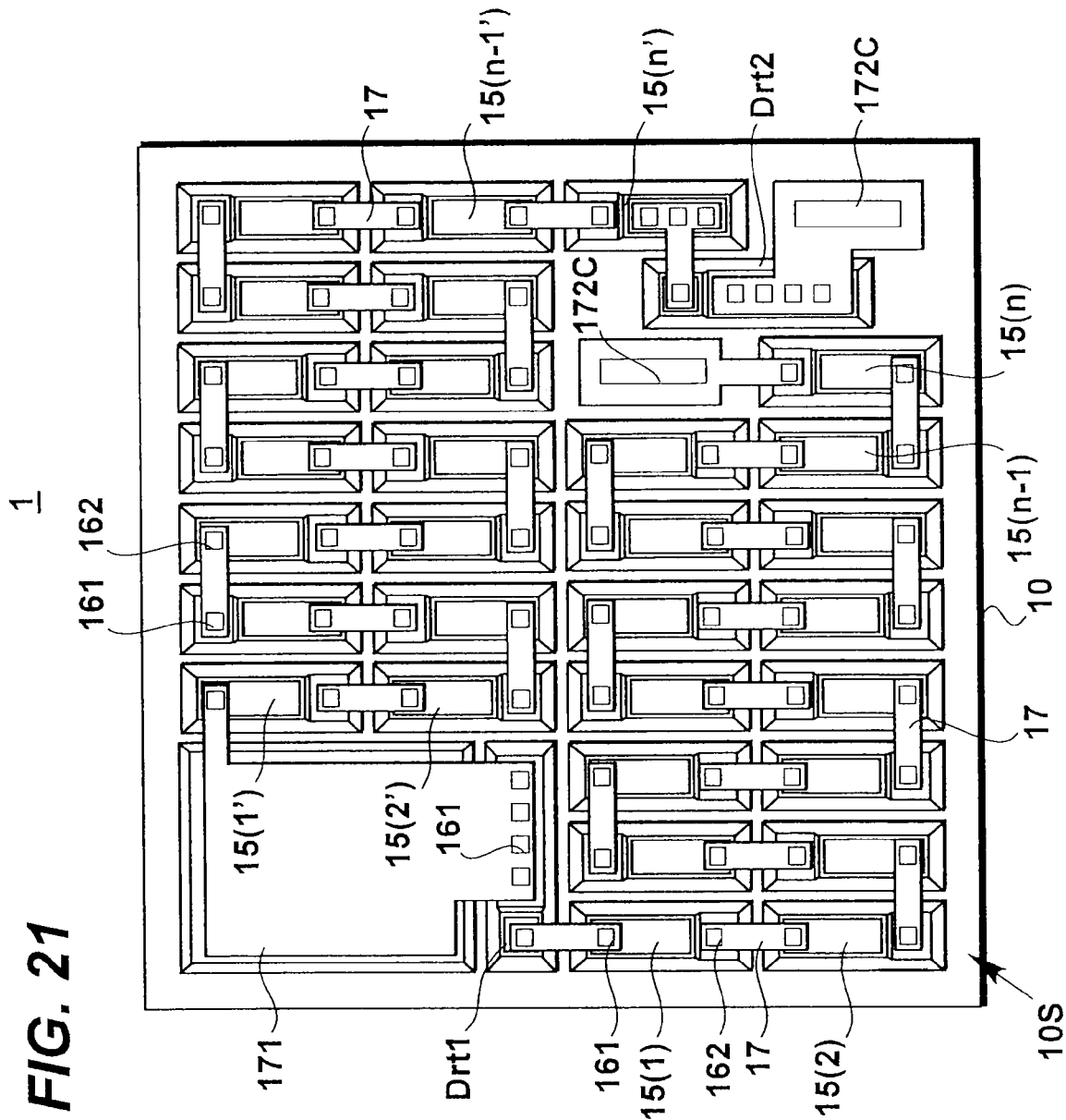
FIG. 21 a top plan view of a light emitting device in modified example 2 of the fourth embodiment.

In the light emitting device 1 of the modified example 2 shown in FIG. 21, the conductor 17 has its one end connected to the first electrodes 152 of the light emitting elements 15(1) to 15($n$), and the other end thereof connected to the connector 172C of the substrate 10. Further, the rear surface 10B of the substrate 10 is used as the first pad 172. The substrate 10 is a conductive substrate such as a single crystal silicon substrate or a SiC substrate or the like.

However, the substrate 10 preferably has high resistance. In such a case, the substrate 10 functions as an external resistor, Even if the light emitting device 1 of the fourth embodiment is connected to the AC power source having a variable voltage, it is possible to reduce the value of current flowing to the light emitting elements 15, and to prevent thermal destruction and so on when the power source has a maximum current value.

The reverse withstand voltage elements Drt1 and Drt2 are arranged as in the light emitting device 1 of the fourth embodiment. Since the second pad 171 and the light emitting elements 15(1) to 15($n$) are not directly connected, none of the backflow preventing elements Dac1 and Dac2 is required.

Figure 22:
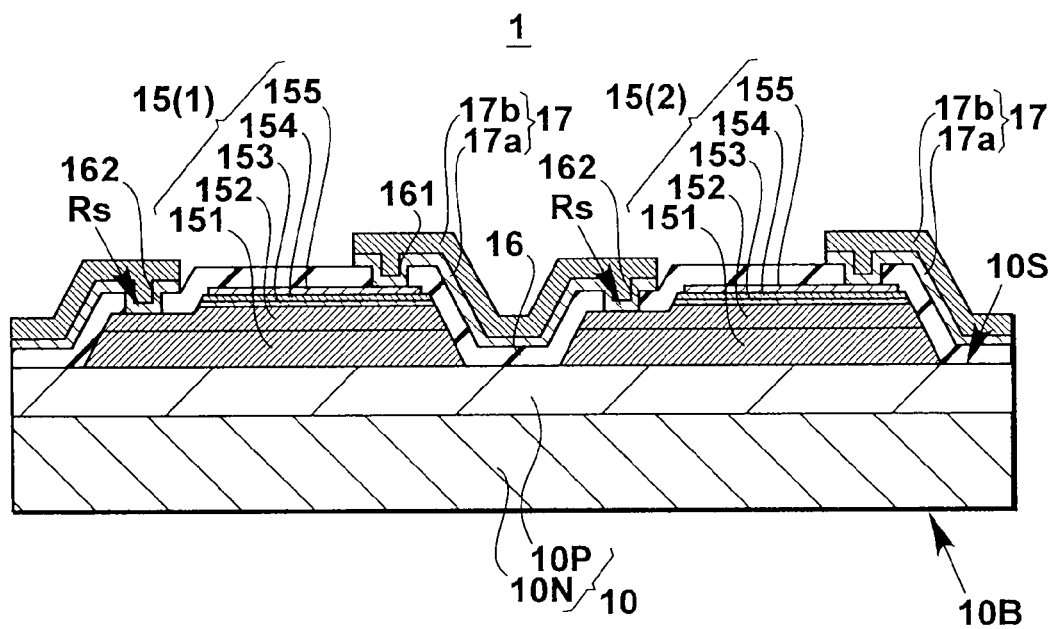
FIG. 22 is an enlarged cross sectional view of an essential part of the light emitting device in modified example 2.

When the rear surface 10B of the substrate 10 is used as the first pad 172, the light emitting elements 15 and so on are electrically isolated from the first pad 172 as shown in FIG. 22 in order that no leak current flows to the light emitting elements 15 and the reverse withstand voltage elements Drt1 and Drt2. For this purpose, the region corresponding to the first pad 172 is made of an n type semiconductor region 10N, and a p type semiconductor region 12P is provided between p type semiconductor region 12P and the an island region (e.g. the buffer layer 151) of the light emitting elements 15. In short, electrical isolation is accomplished by the pn junction.

Figure 23:
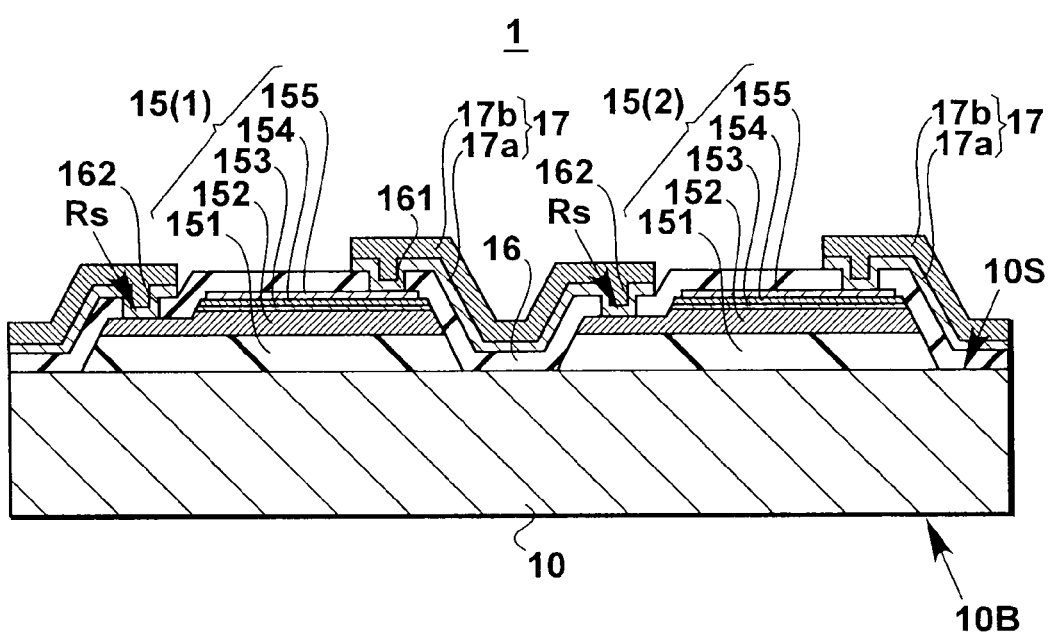
FIG. 23 is an enlarged cross sectional view of an essential part of another light emitting device in modified example 2.

Alternatively, the light emitting elements 15 and the first pad 172 can be electrically disconnected by making the buffer layer 151 insulative. In this case, the buffer layer 151 functions as an insulating region as shown in FIG. 23.

Fifth Embodiment

A fifth embodiment relates to a modified example of the light emitting device 1 of the fourth embodiment.
[Circuit Configuration of Light Emitting Device]

Figure 24:
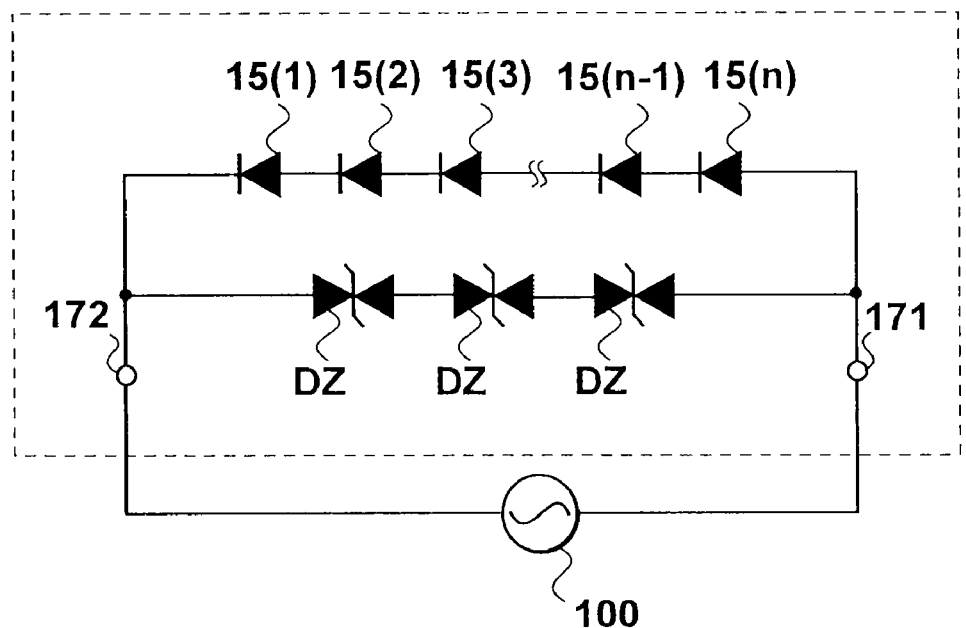
FIG. 24 is a circuit diagram of a light emitting device according to a fifth embodiment of the invention.

As shown in FIG. 24, the light emitting device 1 includes: light emitting elements 15(1) to 15($n$); the second pad 171 electrically connected to an anode electrode of the light emitting element 15($n$); the first pad 172 electrically connected to a cathode electrode of the light emitting element 15(1); and bi-directional zener diodes DZ electrically connected in parallel between the power source 100 and the light emitting elements 15(1) to 15($n$). The bi-directional zener diodes DZ function not only as the reverse withstand voltage element Drt1 and Drt2 but also as the backflow preventing elements Dac1 and Dac2 in the light emitting device 1 of the fourth embodiment. A breakdown voltage of the zener diodes DZ is a sum of a forward voltage of one of the zener diodes and a backward voltage of the other zener diodes. The breakdown voltage is designed to be larger than the voltage of the power source 100, e.g. higher than 140 V which is an actual value of 100 V of a household power source. In this embodiment, three zener diodes DZ are electrically connected in series. The number of zener diodes is limited to three.
[Structure of Light Emitting Device]

Figure 25:
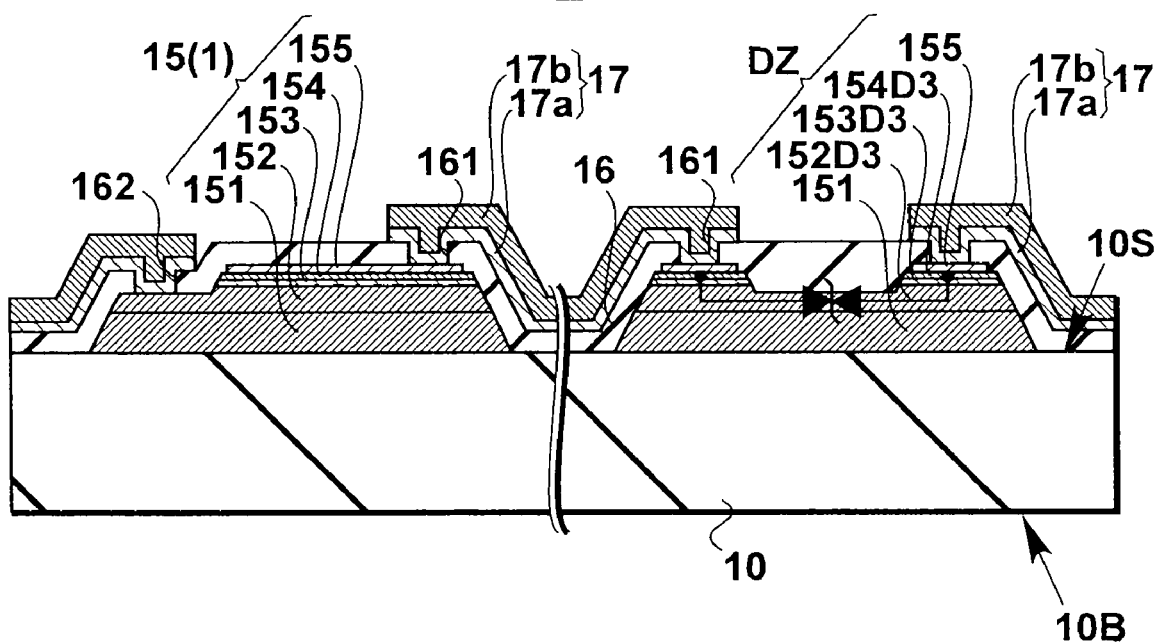
FIG. 25 is an enlarged cross sectional view of an essential part of the light emitting device of the fifth embodiment, taken along line F25-F25 in FIG. 26.
Figure 26:
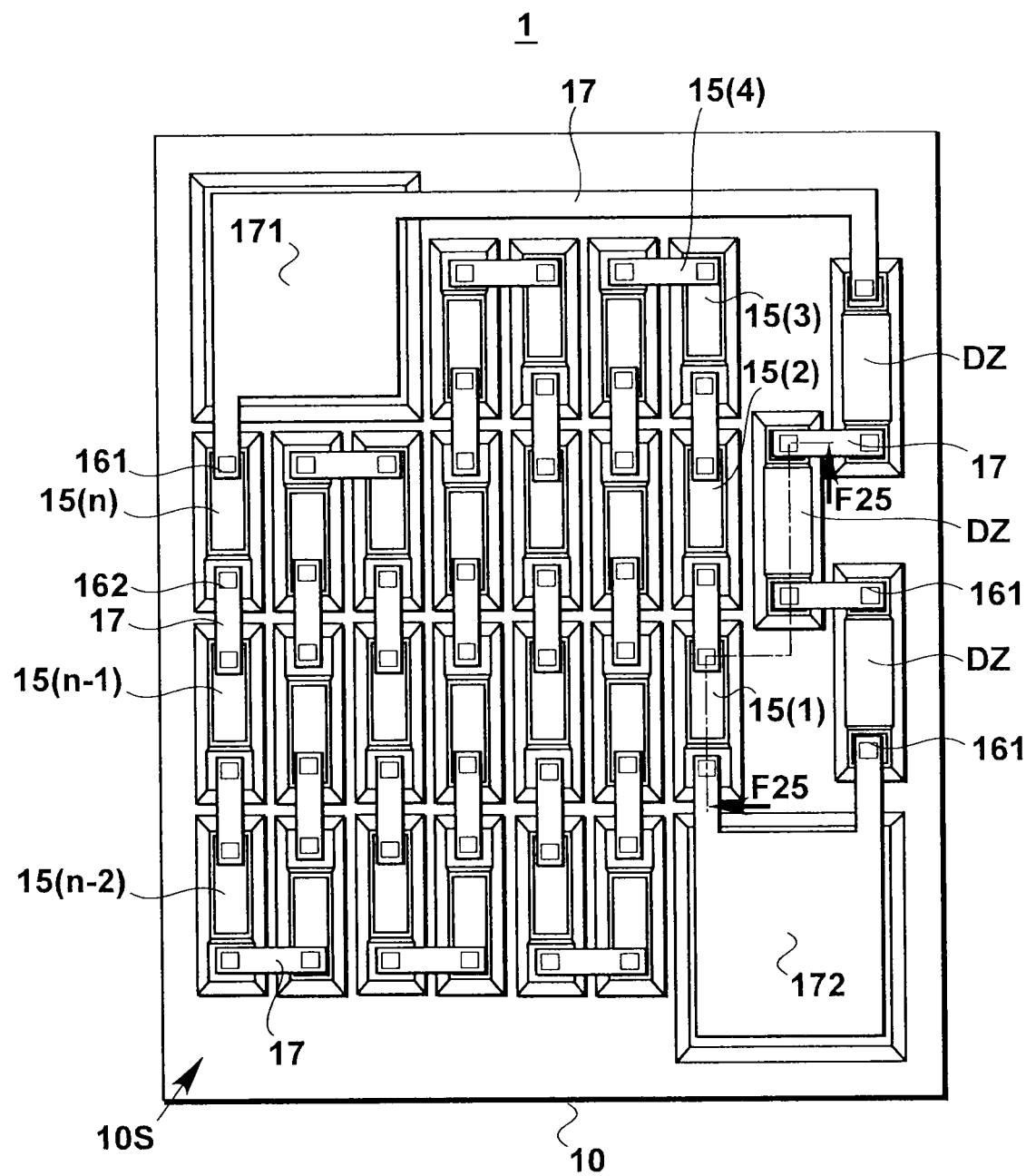
FIG. 26 is a top plan view of the light emitting device of the fifth embodiment.

Referring to FIG. 25 and FIG. 26, the light emitting device 1 includes the following similarly to the light emitting devices 1 of the third or fourth embodiment: the substrate 10; first electrodes 152; active layer 153; second electrodes 154; light emitting elements 15(1) to 15($n$); and zener diodes DZ which have first electrode 152D3 flush with the first electrode 152 on the main surface of the substrate 10, active layer 153D3 flush with the active layer 153, and second electrodes 154D3 flush with the electrode 154.

The zener diodes DZ are p-i-n type diodes since the first electrodes 152D3 are made of n type GaN layers, the active layer 153D3 is made of a nitride semiconductor region having the MQW structure, and the second electrodes 154D3 are made of p type GaN layers. The two zener diodes DZ are shared by the first electrode 152D3, and are connected in series. Each of the two zener diodes DZ shared by the first electrode 152D3 is in the shape of an island. The zener diodes DZ have the cross sections same as those of the light emitting elements 15.

The substrate 10, buffer layer 151, first electrode 152, active layer, second electrode 154, optically transparent conductive film 155, interlayer dielectric film 16 and conductor 17 are same as those of the third or fourth embodiment, and will not be referred to here.

[Planar Structure of Light Emitting Device]

In the light emitting device 1 shown in FIG. 26, the zener diodes DZ are arranged along the upper side of the main surface 10S of the substrate 10 when observed in the planar direction. The first and second pads 172 and 171, light emitting elements 15(1) to 15(n) are arranged similarly to those of the light emitting device 1 of the third embodiment (see FIG. 14).

The light emitting device 1 of the fifth embodiment is as effective as the light emitting device 1 of the fourth embodiment. The zener diodes DZ which are structured similarly to the light emitting elements 15 are provided between the second pad 171 and the first pad 172, and no external protecting element is provided, which is effective in downsizing the light emitting device 1, and improving the ESD withstand voltage.

Other Embodiments

While the embodiments of the invention have been shown and described, it is to be understood that this disclosure is for the purpose of illustration and that various changes and modification may be made without departing from the scope of the invention as set forth in the appended claims. In the foregoing embodiments, light emitting diodes (LEDs) are used as the light emitting elements. Alternatively, semiconductor lasers may be used as the light emitting elements.

What is claimed is:

1. A light emitting device comprising:
a first semiconductor region having a first conductivity type;
a second semiconductor region and a third semiconductor region which are provided in the first semiconductor region and have a second conductivity type opposite to the first conductivity type;
a first semiconductor light emitting element of which first electrode is electrically connected to a main surface of the second semiconductor region, the first electrode carrying a first active layer and a second electrode thereon;
a second semiconductor light emitting element of which third electrode is electrically connected to a main surface of the third semiconductor region, the third electrode carrying a second active layer and a fourth electrode thereon;
a conductor which electrically connects the second electrode of the first semiconductor light emitting element and the third semiconductor region, and which electrically connects the second electrode and the third electrode through the third semiconductor region;
a first pad electrically connected to the first electrode via the second semiconductor region, and electrically connecting the first electrode to one of terminals of a power source; and
a second pad electrically connected to the fourth electrode, and electrically connecting the fourth electrode to the other terminal of the power source, wherein
the first semiconductor region is an n type semiconductor substrate or an n type semiconductor region;
the second and third semiconductor regions are p type semiconductor regions;
the first electrode of the first semiconductor light emitting element and the third electrode of the second light emitting element include nitride group chemical semiconductor layers in which n type impurities are doped; and
the second electrode of the first semiconductor light emitting element and the fourth electrode of the second semiconductor light emitting element include nitride group chemical layers in which p type impurities are doped.

2. The light emitting device defined in claim 1, wherein a rectifier is provided between the first pad and the second semiconductor region, and between the second pad and the fourth electrode of the second semiconductor light emitting element.

3. The light emitting device defined in claim 1, wherein a plurality of the first semiconductor light emitting elements and the second second semiconductor light emitting elements are spirally and repeatedly arranged around the first pad or the second pad.

4. The light emitting device defined in claim 3, wherein a rectifier is provided between the first pad and the second semiconductor region, and between the second pad and the fourth electrode of the second semiconductor light emitting element.

5. The light emitting device defined in claim 1 further comprising:
a first power source plug terminal electrically connected to the first pad, and electrically connecting the first pad to the one terminal of the power source; and
a second power source plug terminal electrically connected to the second pad, and electrically connecting the second pad to the other terminal of the power source.

6. The light emitting device defined in claim 5, wherein a plurality of the first semiconductor light emitting elements element and the second second semiconductor light emitting elements are spirally and repeatedly arranged around the first pad or the second pad.

7. The light emitting device defined in claim 5, wherein the first and second power source plug terminals are connected to terminals of a DC power source of 5 V, 6 V, 9 V, 12 V or 24 V.

8. The light emitting device defined in claim 5, wherein the first and second power source plug terminals are connected to terminals of a commercial AC 100 V power source.

9. The light emitting device defined in claim 8, wherein a rectifier is provided between the first pad and the second semiconductor region, and between the second pad and the fourth electrode of the second semiconductor light emitting element.

10. A light emitting device comprising:
a substrate;
a plurality of semiconductor light emitting elements including a first nitride semiconductor region having an n type conductivity type, a nitride active layer, and a second nitride semiconductor region having a p type conductivity type opposite to the n type conductivity type;

a connecting conductor electrically connecting the first nitride semiconductor region of a first semiconductor element out of the plurality of semiconductor elements and the second nitride semiconductor region of a second semiconductor element, and electrically connecting the plurality of the semiconductor elements, the connecting conductor having Schottky property with respect to the first nitride semiconductor region;

a first bonding pad electrically connected to one end of the plurality of semiconductor light emitting elements, and electrically connecting the semiconductor light emitting elements to one terminal of a power source; and a second bonding pad electrically connected to the plurality of semiconductor elements, and electrically connecting the second semiconductor region to the other terminal of the power source.

11. The light emitting device defined in claim 10, wherein an amount of the current at an interface between the first nitride semiconductor region and the connecting conductor is equal to or less than 10 mA.

12. The light emitting device defined in claim 10, wherein the connecting conductor includes a Ti film extending over the first nitride semiconductor region and an Au film extending over the Ti film.

13. The light emitting device defined in claim 10, wherein either the first bonding pad or the second bonding pad is the substrate.

14. A light emitting device comprising:
a substrate;
a plurality of semiconductor light emitting elements including a first semiconductor region having a first conductivity type, a first active layer, and a second semiconductor region having a second conductivity type opposite to the first conductivity type, and being electrically connected in series on one surface of the substrate;
a first bonding pad electrically connected to the first semiconductor region of a first semiconductor element at one end of the plurality of semiconductor elements, and electrically connecting the first semiconductor region to one terminal of a power source;
a second bonding pad electrically connected to the second semiconductor region of a second semiconductor element at the other end of the plurality of the semiconductor elements, and electrically connecting the second semiconductor region to the other end of the power source; and
a reverse withstand voltage element which is electrically connected, on the substrate, between the first semiconductor region of the first semiconductor element and the first bonding pad, and includes a third semiconductor region being flush with the first semiconductor region and having the first conductivity type, a second active layer being flush with the first active layer, and a fourth semiconductor region being flush with the first active layer and the semiconductor region, and having the second conductivity type.

15. The light emitting device defined in claim 14 further comprising
a backflow preventing element which is electrically connected between the second semiconductor region of the second light emitting element and the second bonding pad, and includes a fifth semiconductor region being flush with the first semiconductor region and having the first conductivity type, a third active layer being flush with the first active layer, and a sixth semiconductor region being flush with the second semiconductor region and having the second conductivity type.

16. The light emitting device defined in claim 15, wherein the first bonding pad is provided on a first island on the substrate, and the reverse withstand voltage overlaps with the first bonding pad on the first island.

17. The light emitting device defined in claim 16, wherein the second bonding pad is provided on a second island on the substrate, and the backflow preventing element overlaps with the second bonding pad on the second island.

18. A light emitting device comprising:
a substrate;
a plurality of semiconductor light emitting elements including a first semiconductor region having a first conductivity type, a first active layer, and a second semiconductor region having a second conductivity type opposite to the first conductivity type, and being electrically connected in series on one surface of the substrate;
a first bonding pad electrically connected to the first semiconductor region of a first semiconductor element at one end of the plurality of semiconductor elements, and electrically connecting the first semiconductor region to one terminal of a power source;
a second bonding pad electrically connected to the second semiconductor region of a second semiconductor element at the other end of the plurality of the semiconductor elements, and electrically connecting the second semiconductor region to the other end of the power source; and
a bi-directional zener diode which is electrically connected, on the substrate, between the first semiconductor region of the first semiconductor element and the second semiconductor region of the second semiconductor element, and includes a third semiconductor region being flush with the first semiconductor region and having the first conductivity type, a second active layer being flush with the first active layer, and a fourth semiconductor region being flush with the first active layer and the semiconductor region, and having the second conductivity type.

* * * * *